US010164054B2

(12) United States Patent
Yang et al.

(10) Patent No.: US 10,164,054 B2
(45) Date of Patent: Dec. 25, 2018

(54) COMPOUND SEMICONDUCTOR FIELD EFFECT TRANSISTOR WITH SELF-ALIGNED GATE

(71) Applicant: QUALCOMM Incorporated, San Diego, CA (US)

(72) Inventors: Bin Yang, San Diego, CA (US); Gengming Tao, San Diego, CA (US); Xia Li, San Diego, CA (US); Periannan Chidambaram, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/683,530

(22) Filed: Aug. 22, 2017

(65) Prior Publication Data

US 2018/0277657 A1  Sep. 27, 2018

Related U.S. Application Data

(60) Provisional application No. 62/476,564, filed on Mar. 24, 2017.

(51) Int. Cl.
*H01L 29/66* (2006.01)
*H01L 29/40* (2006.01)
(Continued)

(52) U.S. Cl.
CPC .. *H01L 29/66621* (2013.01); *H01L 21/76822* (2013.01); *H01L 29/402* (2013.01);
(Continued)

(58) Field of Classification Search
CPC ......... H01L 29/66621; H01L 29/42316; H01L 29/66462; H01L 29/7787; H01L 29/7786; H01L 29/778; H01L 29/7782
See application file for complete search history.

(56) References Cited

U.S. PATENT DOCUMENTS 6,294,446 B1   9/2001  Ishikawa
7,804,114 B1   9/2010  Milosavljevic et al.
(Continued)

FOREIGN PATENT DOCUMENTS

EP    0592064 A2   4/1994
WO    2016024960 A1   2/2016

OTHER PUBLICATIONS

Cho S-J., et al., "Effects of Double Passivation for Optimize DC Properties in Gamma-Fate Algan/Gan High Electron Mobility Transistor by Plasma Enhanced Chemical Vapor Deposition", Thin Solid Films, Elsevier, Amsterdam, NL, vol. 520, No. 13, Feb. 8, 2012, pp. 4455-4458, XP028477850, ISSN: 0040-6090, DOI: 10.1016/J.TSF. 2012.02.055 [retrieved on Feb. 15, 2012].
(Continued)

*Primary Examiner* — Matthew Reames
*Assistant Examiner* — John Bodnar
(74) *Attorney, Agent, or Firm* — Qualcomm Inc./Seyfarth Shaw; Alan M. Lenkin

(57) ABSTRACT

A compound semiconductor field effect transistor (FET) may include a channel layer. The semiconductor FET may also include an oxide layer, partially surrounded by a passivation layer, on the channel layer. The semiconductor FET may also include a first dielectric layer on the oxide layer. The semiconductor FET may also include a second dielectric layer on the first dielectric layer. The semiconductor FET may further include a gate, comprising a base gate through the oxide layer and the first dielectric layer, and a head gate in the second dielectric layer and electrically coupled to the base gate.

13 Claims, 30 Drawing Sheets

(51) Int. Cl.
*H01L 29/423* (2006.01)
*H01L 29/778* (2006.01)
*H01L 21/768* (2006.01)
*H01L 29/812* (2006.01)

(52) U.S. Cl.
CPC .. *H01L 29/42316* (2013.01); *H01L 29/66462* (2013.01); *H01L 29/66575* (2013.01); *H01L 29/7787* (2013.01); *H01L 29/8128* (2013.01)

(56) References Cited

U.S. PATENT DOCUMENTS

| | | |
|---|---|---|
| 8,039,903 B1 | 10/2011 | Milosavljevic et al. |
| 8,343,829 B2 | 1/2013 | Wang et al. |
| 8,383,471 B1 | 2/2013 | Shinihara et al. |
| 9,117,838 B2 | 8/2015 | Xu et al. |
| 10,084,074 B1 | 9/2018 | Yang et al. |
| 2011/0147798 A1 | 6/2011 | Radosavljevic et al. |
| 2013/0075722 A1 | 3/2013 | Yamazaki et al. |
| 2013/0105817 A1* | 5/2013 | Saunier ............ H01L 29/778 257/77 |
| 2013/0277680 A1* | 10/2013 | Green ............ H01L 29/402 257/76 |
| 2013/0295757 A1 | 11/2013 | Xu et al. |
| 2014/0017885 A1 | 1/2014 | Yoon et al. |
| 2015/0021662 A1 | 1/2015 | Basu et al. |
| 2015/0311084 A1 | 10/2015 | Moore et al. |
| 2015/0357452 A1* | 12/2015 | Green ............ H01L 29/402 257/194 |

OTHER PUBLICATIONS

Grebennikov A., "High-Efficiency Transmission-Line GaN HEMT Inverse Class F Power Amplifier for Active Antenna Arrays", Microwave Conference, 2009, APMC 2009, Asia Pacific, IEEE, Piscataway, NJ, USA, Dec. 7, 2009, pp. 317-320, XP031614118, ISBN: 978-1-4244-2801-4.

International Search Report and Written Opinion—PCT/US2018/016254—ISA/EPO—dated May 3, 2018.

\* cited by examiner

COMPOUND SEMICONDUCTOR FIELD EFFECT TRANSISTOR WITH SELF-ALIGNED GATE

CROSS-REFERENCE TO RELATED APPLICATION

This application claims the benefit of U.S. Provisional Patent Application No. 62/476,564, filed on Mar. 24, 2017, and entitled "COMPOUND SEMICONDUCTOR FIELD EFFECT TRANSISTOR GATE LENGTH SCALING WITH SELF-ALIGNED GATE," the disclosure of which is expressly incorporated by reference herein in its entirety.

BACKGROUND

Field

The present disclosure relates generally to wireless communication systems and, more specifically, to a compound semiconductor field effect transistor including a self-aligned gate.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), pseudomorphic high electron mobility transistors (pHEMTs), and the like.

Further design challenges for mobile RF transceivers include performance considerations for meeting future 5G and 5G+ transmission frequency specifications. These future 5G/5G+ performance specifications mandate a ten-fold transmission frequency increase (e.g., 28 GHz to 86 GHz) over current standards. Unfortunately, many compound semiconductor transistors are generally unable to meet these future 5G/5G+ performance specifications due to, for example, a lack of self-aligned gates as well as a large gate to source/drain space, which limits device performance.

SUMMARY

A compound semiconductor field effect transistor (FET) may include a channel layer. The semiconductor FET may also include an oxide layer, partially surrounded by a passivation layer, on the channel layer. The semiconductor FET may also include a first dielectric layer on the oxide layer. The semiconductor FET may also include a second dielectric layer on the first dielectric layer. The semiconductor FET may further include a gate, comprising a base gate through the oxide layer and the first dielectric layer, and a head gate in the second dielectric layer and electrically coupled to the base gate.

A method of making a compound semiconductor field effect transistor (FET) may include forming a cavity in a compound semiconductor active layer of the compound semiconductor FET through an opening in a first dielectric layer on the compound semiconductor active layer to form a recessed gate region. The method may also include etching through an oxide layer in the opening within the first dielectric layer and in the cavity of the recessed gate region to create a base gate opening. The method may also include filling the base gate opening with a first conductive gate material to create a base gate. The method may further include plating a second conductive gate material on the base gate to create a head gate electrically contacting the base gate.

A radio frequency (RF) front end module may include a chip, comprising a channel layer, an oxide layer partially surrounded by a passivation layer on the channel layer, a first dielectric layer on the oxide layer, and a gate, comprising a base gate through the oxide layer and the first dielectric layer, and a head gate in a second dielectric layer on the first dielectric layer and electrically coupled to the base gate. The RF may also include an antenna coupled to an output of the chip.

A compound semiconductor field effect transistor (FET) may include a means for conducting electrons between a source and a drain. The compound semiconductor FET may also include an oxide layer, partially surrounded by a passivation layer, on the means for conducting electrons. The compound semiconductor FET may also include a first dielectric layer on the oxide layer. The compound semiconductor FET may also include a second dielectric layer on the first dielectric layer. The compound semiconductor FET may further include a gate, comprising a base gate through the oxide layer and the first dielectric layer, and a head gate in the second dielectric layer and electrically coupled to the base gate.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is

DETAILED DESCRIPTION

Figure 1:
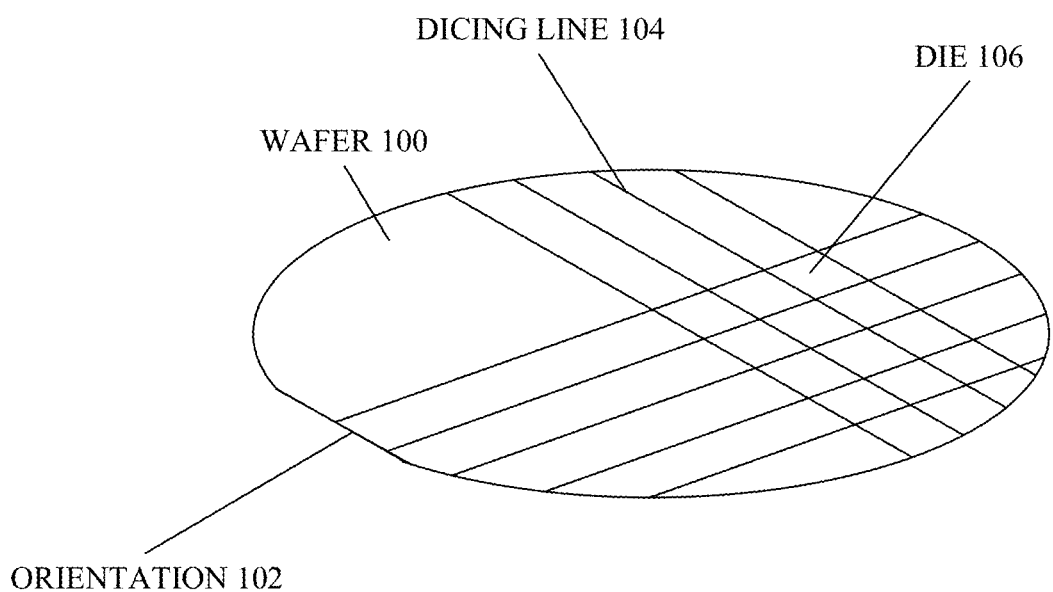
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabrication of mobile radio frequency (RF) chips (e.g., mobile RF transceivers) becomes complex at deep sub-micron process nodes due to cost and power consumption considerations. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal.

The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), pseudomorphic high electron mobility transistors (PHEMTs), and the like.

Further design challenges for mobile RF transceivers include performance considerations for meeting future 5G and 5G+ transmission frequency specifications. These future 5G/5G+ performance specifications mandate a ten-fold transmission frequency increase (e.g., 28 GHz to 86 GHz) over current standards. Unfortunately, current compound semiconductor transistors, such as bipolar transistors are unable to meet these future 5G/5G+ performance specifications.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers. Unfortunately, heterojunction bipolar transistors are also unable to meet future 5G/5G+ performance specifications.

A high electron mobility transistor (HEMT) is a type of field effect transistor (FET) that relies on a junction between different semiconductor materials with different bandgaps to form a heterojunction. A high electron mobility transistor may also use a III-V compound semiconductor material, a II-VI compound semiconductor material, or other like compound semiconductor material, which exhibits high carrier mobility and direct energy gaps. High electron mobility transistors rely on an epitaxial structure, in which layers with different band gaps are grown on a compound semiconductor substrate to form heterojunctions. High electron mobility transistors improve upon heterojunction transistors by supporting substantially higher transmission frequencies, which may meet future 5G/5G+ performance specifications.

For example, a compound semiconductor (e.g., GaAs) pseudomorphic high electron mobility transistor (pHEMT) may support a transmission frequency (Ft)/maximum frequency (Fmax) in excess of one-hundred gigahertz (e.g., Ft/Fmax>100 GHz). The increased transmission frequency supported by a pseudomorphic high-electron-mobility transistor, however, relies on an electron beam (e-beam) process to scale a gate length (Lgate) to approximately one-tenth of a micrometer (e.g., ~0.1 um). Unfortunately, the electron beam process used to scale the gate length Lgate of pseudomorphic high electron mobility transistors is a non-self-aligned gate process. Furthermore, the electron beam process is expensive and provides low throughput.

Similarly, although an indium phosphide (InP) heterojunction bipolar transistor may support a transmission frequency/maximum frequency in excess of three-hundred gigahertz (e.g., Ft/Fmax>300 GHz), this device is also inadequate because the substrate and epitaxial layers are at least five times more expensive than GaAs compound semiconductor materials. In addition, gallium nitride (GaN) high electron mobility transistors, which also support a transmission frequency/maximum frequency in excess of one-hundred gigahertz (e.g., Ft/Fmax>100 GHz) similarly rely on substrate and epitaxial layers that are at least five times more expensive than GaAs compound semiconductor materials. Gallium nitride high electron mobility transistors are also immature devices for supporting mobile platform devices (e.g., smartphones).

Successful fabrication of modern semiconductor chip products, such as compound semiconductor bipolar transistors and field effect transistors (FETs) involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.) The front-end-of-line processes may include the set of process steps that form the active devices, such as transistors, capacitors, and diodes.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation as well as stress introduction. The back-end-of-line processes may include the set of process steps that form the interconnects that tie the independent transistors and form circuits.

While heterojunction bipolar transistors and pseudomorphic high electron mobility transistors offer possible solutions for meeting future 5G/5G+ performance specifications, these transistors suffer from gate to source/drain spacing issues as well as a lack of gate alignment. For example, conventional compound semiconductor (e.g., GaAs, InP, and GaN) high electron mobility transistors are generally fabricated without self-aligned gates. The lack of self-aligned gates may be due to forming of the gate after forming of a source/drain recess. The lack of self-aligned gates may also be due to space limitations in conventional processing steps for fabricating a gate length less than 0.1 microns.

In addition, compound semiconductor FETs may not meet future 5G/5G+ performance specifications due to a large minimum gate to source/drain space (e.g., 0.2 to 0.3 micrometers). A minimum gate-to-source/drain space is generally determined by controlling process steps for gate formation (e.g., recess lithography, recess etch, and gate photolithography). The large gate to source/drain space may limit device performance as well as device integration density. For example, the large gate to source/drain space increases parasitic resistance that limits performance of compound semiconductor FETs. Therefore, a desire exists for a device and process that provides self-aligned gates, while reducing a gate to source/drain space to overcome the challenges described above.

Aspects of the present disclosure are directed to an innovative compound semiconductor FET having a gate (e.g., a T-gate) that is self-aligned with a source/drain region. In one arrangement, the gate includes a base gate and a head gate, in which a space between the base gate and a source/drain region may be reduced to a predetermined value (e.g., 20 nanometers). The reduced gate to source/drain space improves device integration density. The reduced space also improves device performance by reducing, for example, parasitic resistance. Such a device and method enable a low cost compound semiconductor FET (e.g., a gallium arsenide (GaAs) pseudomorphic high electron mobility transistor) device for 5G wireless communications.

A compound semiconductor FET may include a first dielectric layer surrounded by a passivation layer on a channel layer of a compound semiconductor material layer stack. The compound semiconductor FET also includes a second dielectric layer on the first dielectric layer. A gate of the compound semiconductor FET may include a base gate and a head gate. The base gate may extend through the first dielectric layer and the second dielectric layer, and electrically contact the channel layer. In addition, a head gate may be in a third dielectric layer on the second dielectric layer and electrically coupled to the base gate. The gate head may be a T-gate, a gamma gate, or other like gate configuration.

According to aspects of the present disclosure, the first dielectric layer is an oxide layer, which may be a complementary metal oxide semiconductor (CMOS) compatible spin on oxide that is liquid at room temperature. A liquid oxide material may be subject to a planarization coating process followed by a bake process (e.g., 400° C.) to form a solid spin-on oxide (dielectric) layer to provide a recessed gate region. A base gate may extend through the oxide dielectric layer, which self-aligns the base gate with a source/drain region in an active layer of a compound semiconductor FET. The base gate may stop on a passivation oxide layer to enable formation of a metal oxide semiconductor (MOS) FET (MOSFET) gate compound semiconductor FET, having a reduced gate to source/drain space. A Schottky gate compound semiconductor FET may include a base gate that stops on a channel layer of a compound semiconductor material stack.

Figure 4:
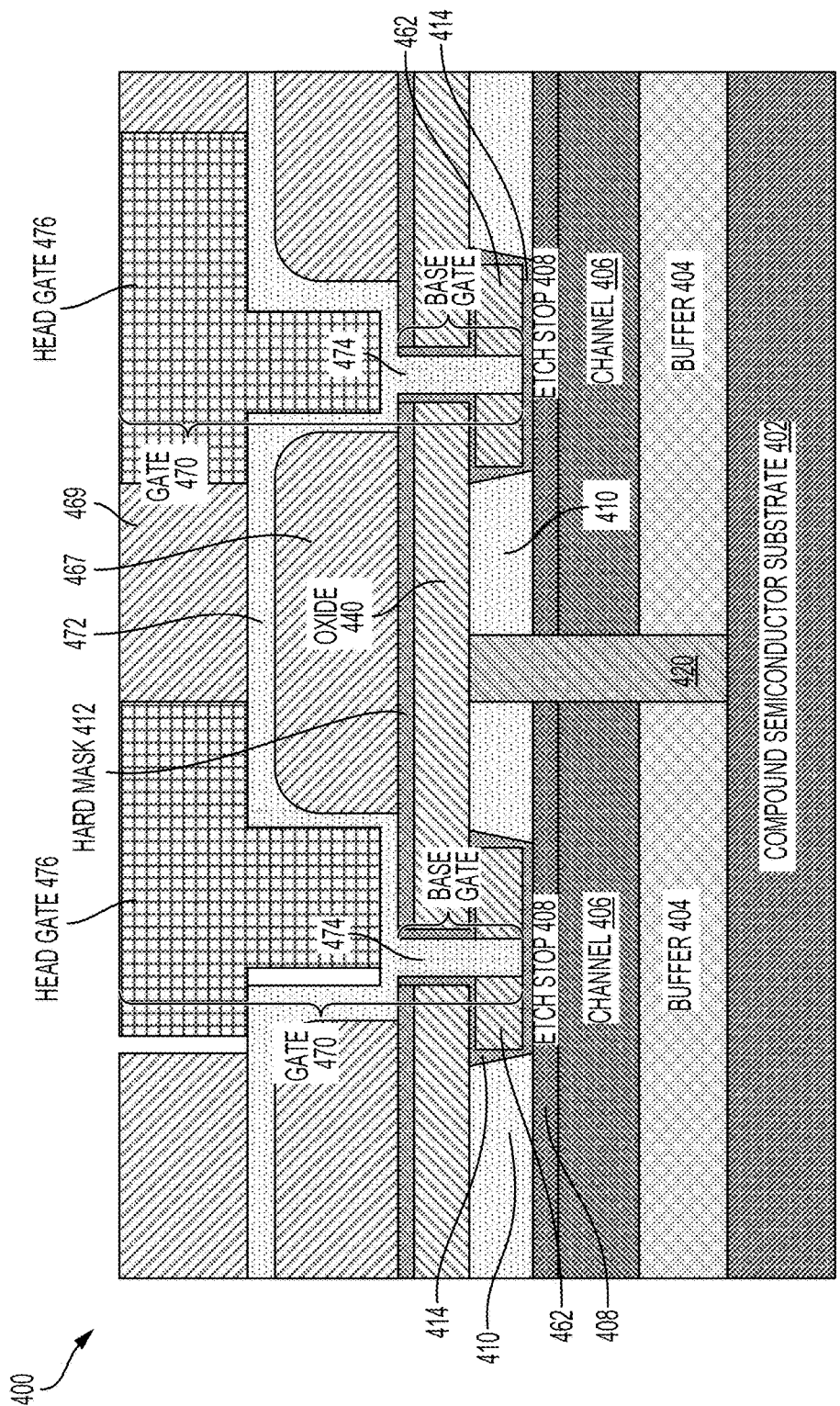
FIG. 4 illustrates a compound semiconductor field effect transistor (FET) having a self-aligned gate according to aspects of the present disclosure.
Figure 5A:
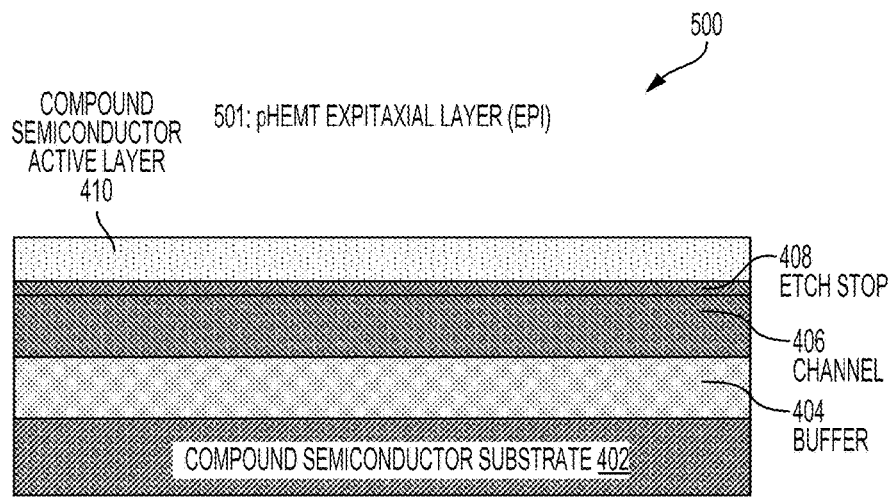
FIGS. 5A-5P illustrate formation of the compound semiconductor field effect transistor (FET) of FIG. 4 according to aspects of the present disclosure.
Figure 5B:
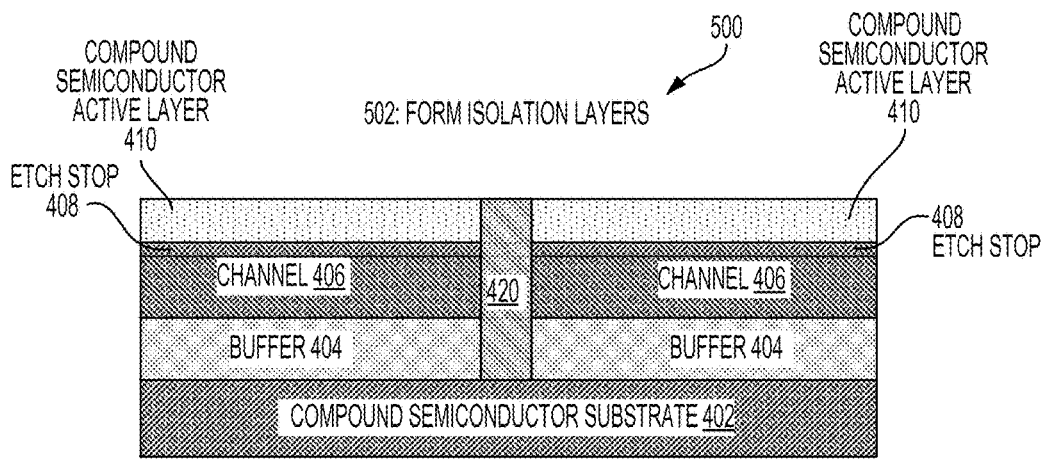
Figure 5C:
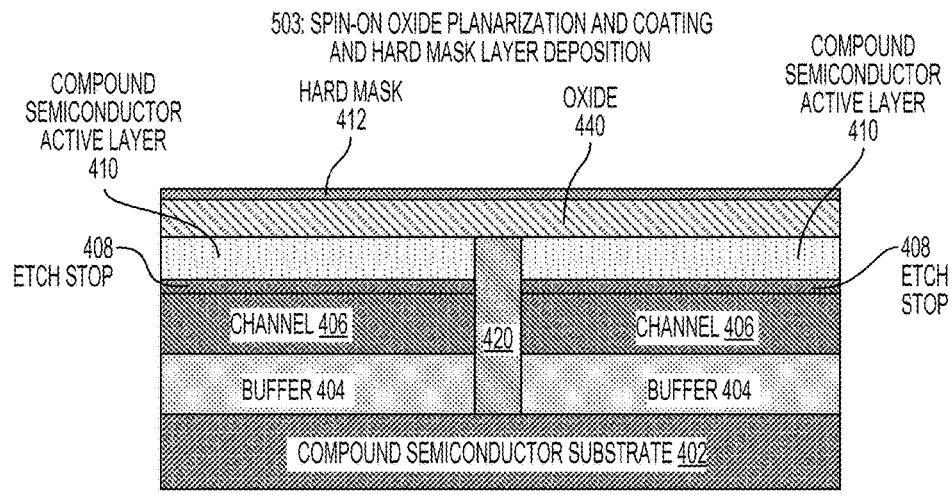
Figure 5D:
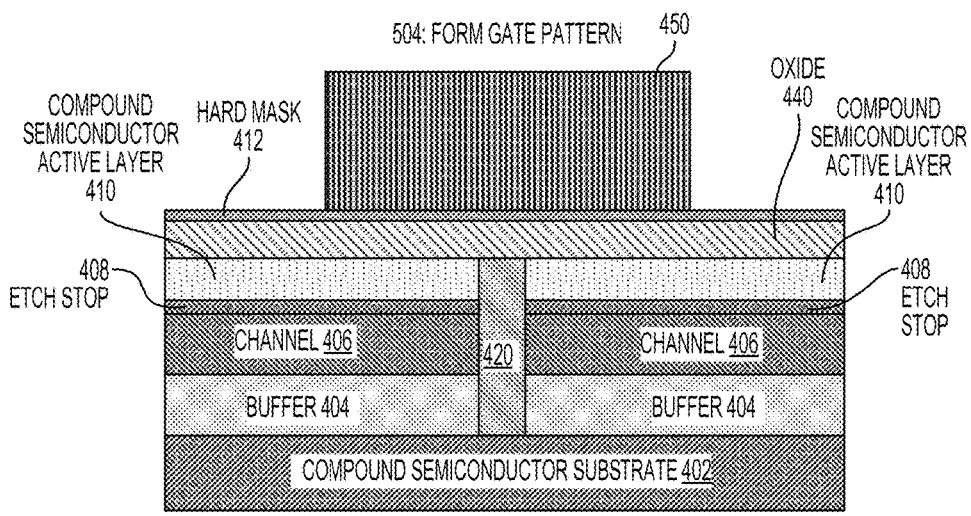
Figure 5E:
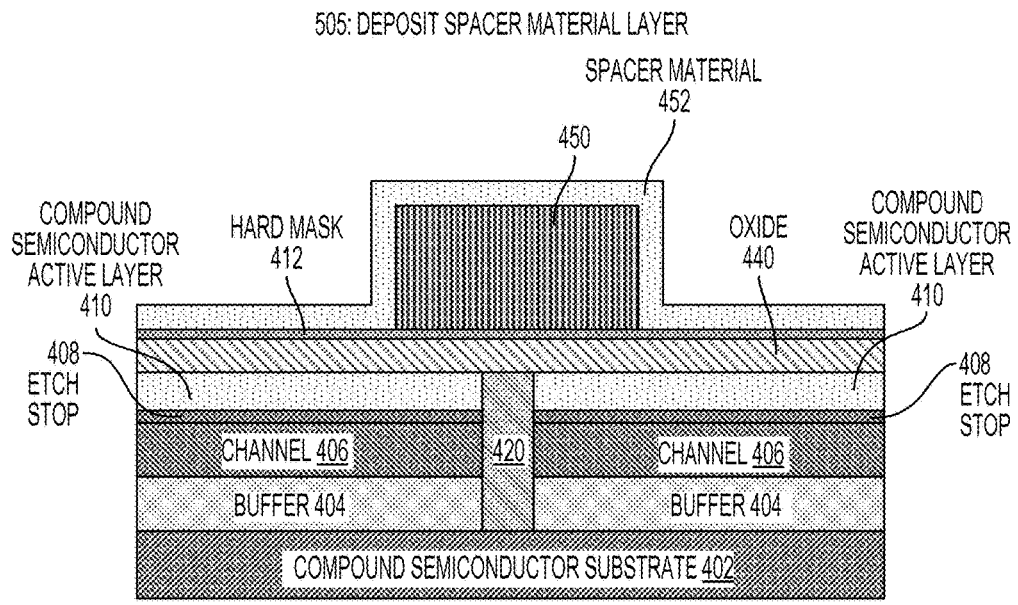
Figure 5F:
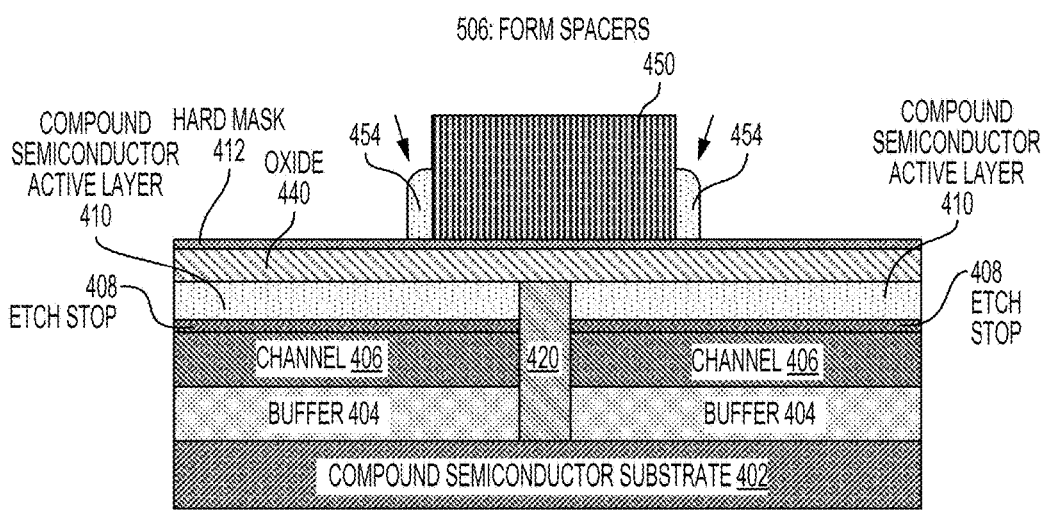
Figure 5G:
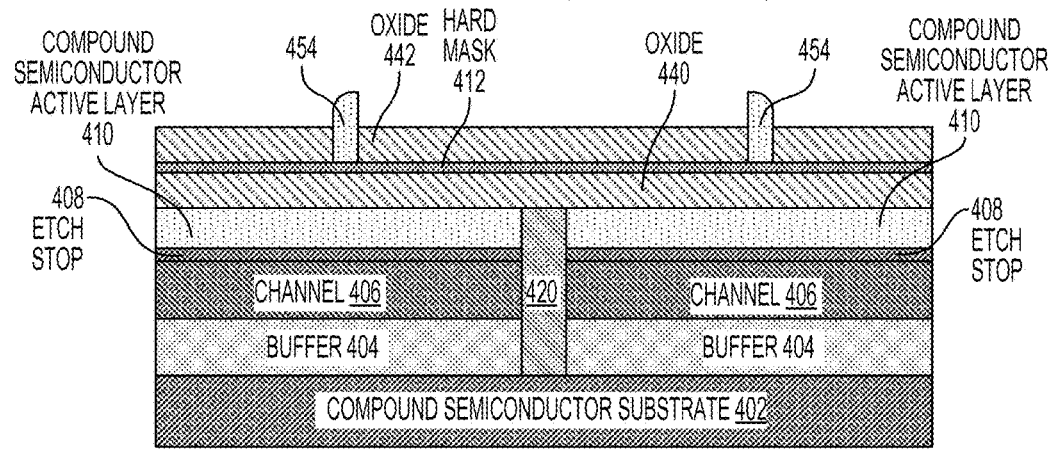
Figure 5H:
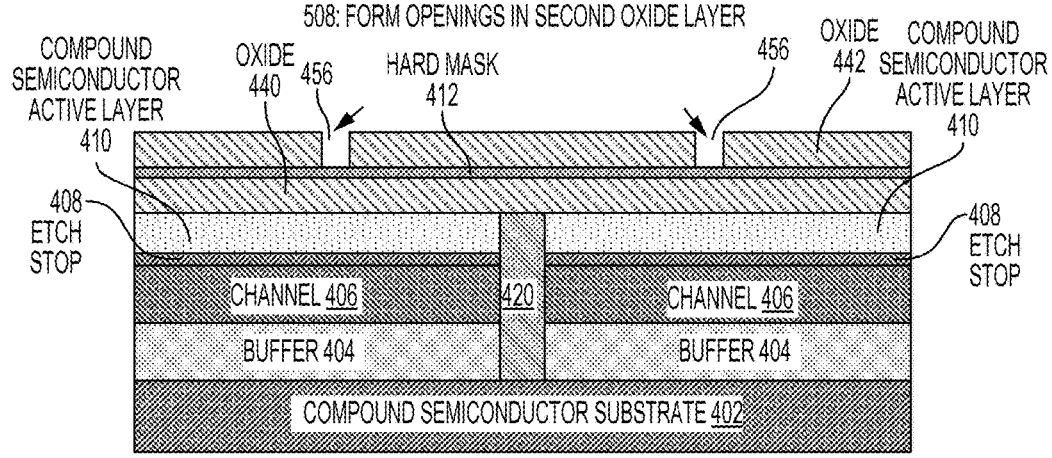
Figure 5I:
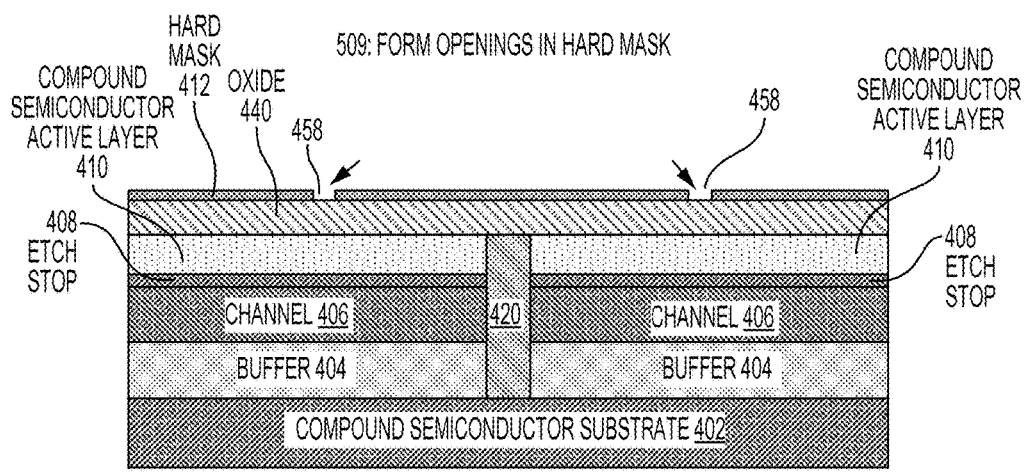
Figure 5J:
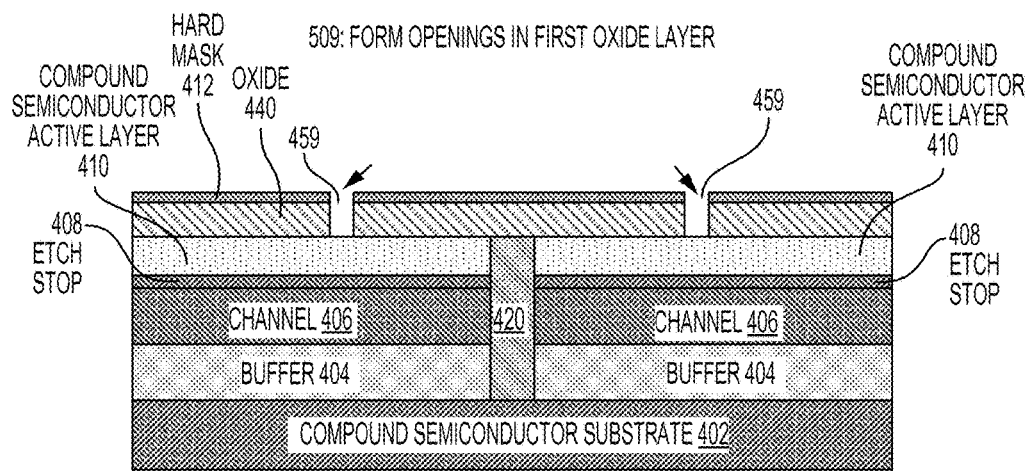
Figure 5K:
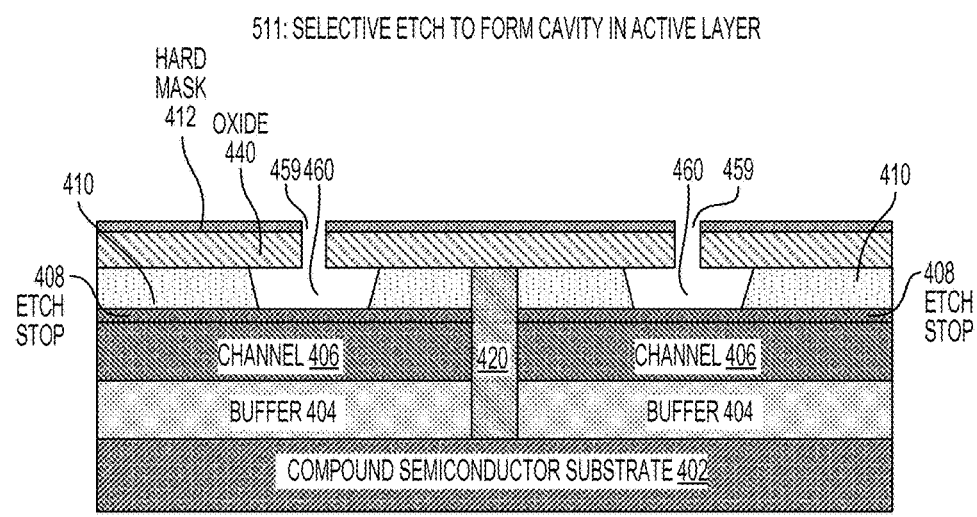
Figure 5L:
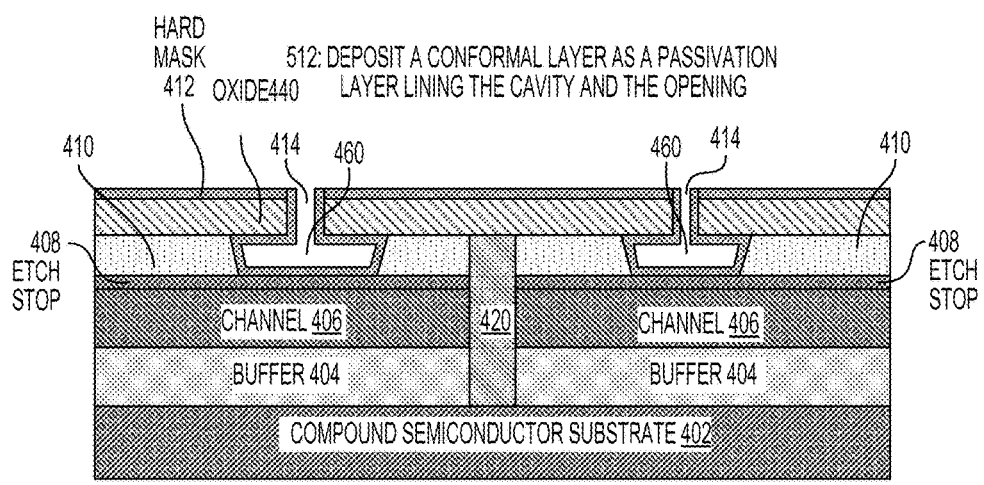
Figure 5M:
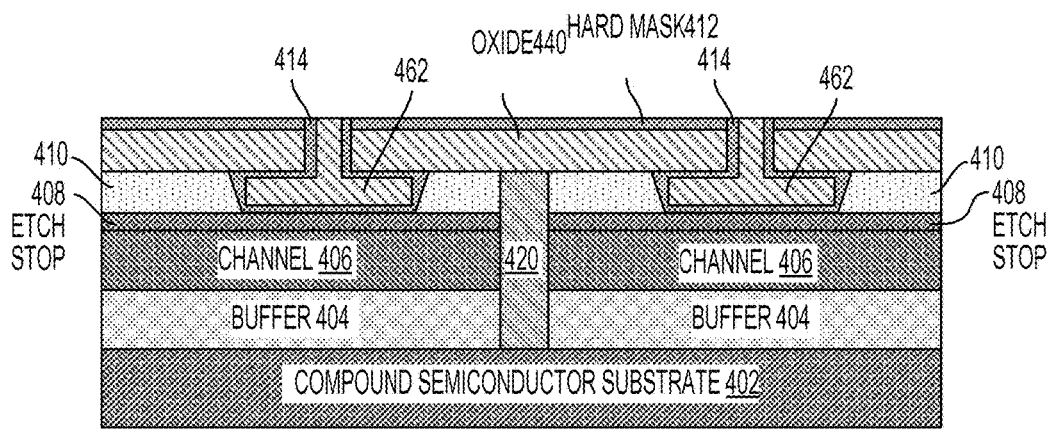
Figure 5N:
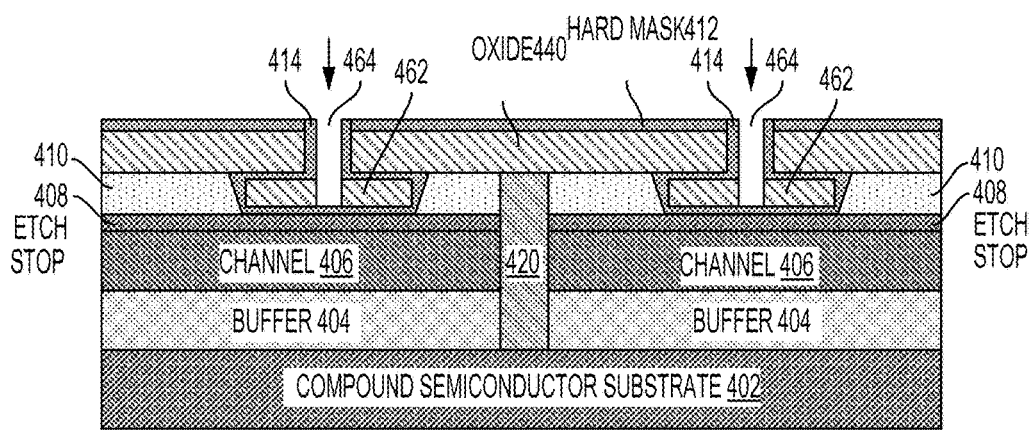
Figure 5O:
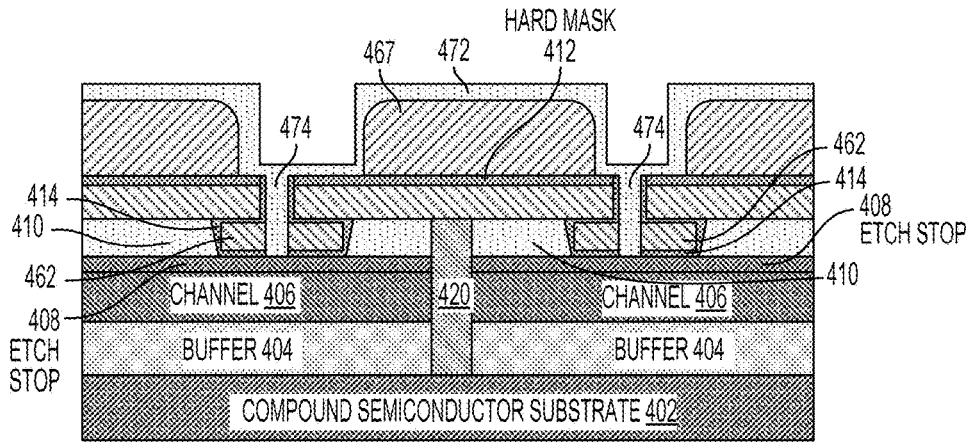
Figure 5P:
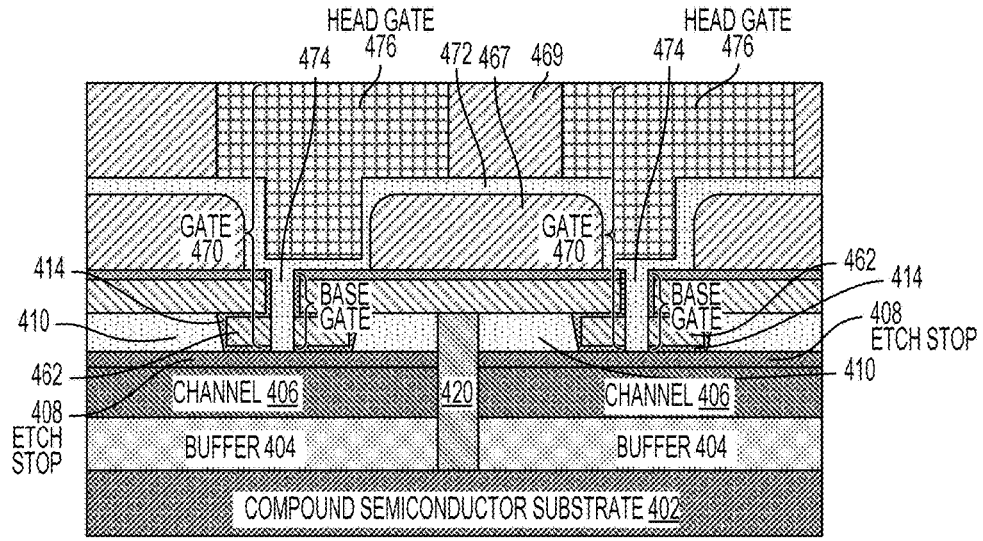
Figure 6:
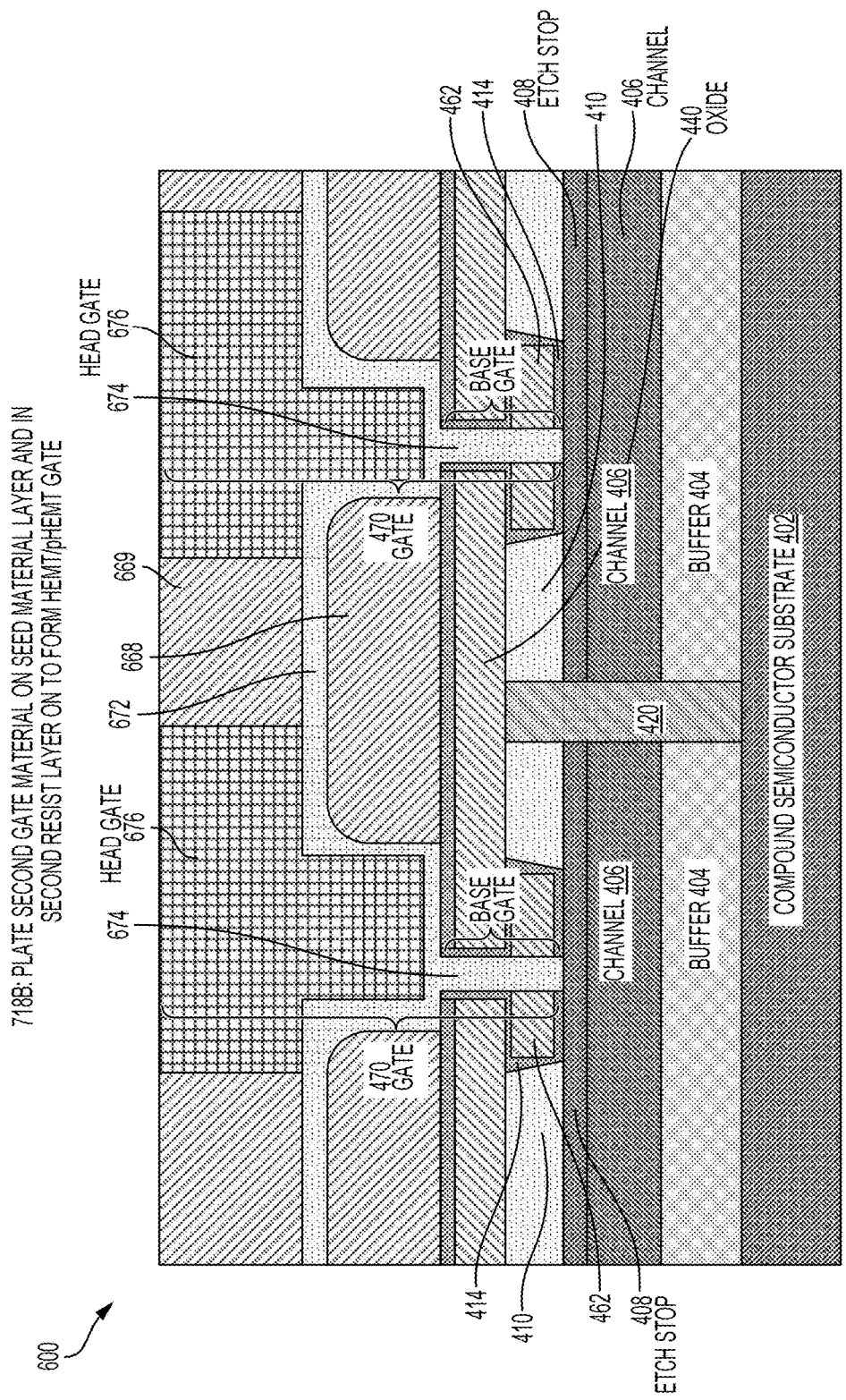
FIG. 6 illustrates a compound semiconductor field effect transistor (FET) having a self-aligned gate according to further aspects of the present disclosure.
Figure 7A:
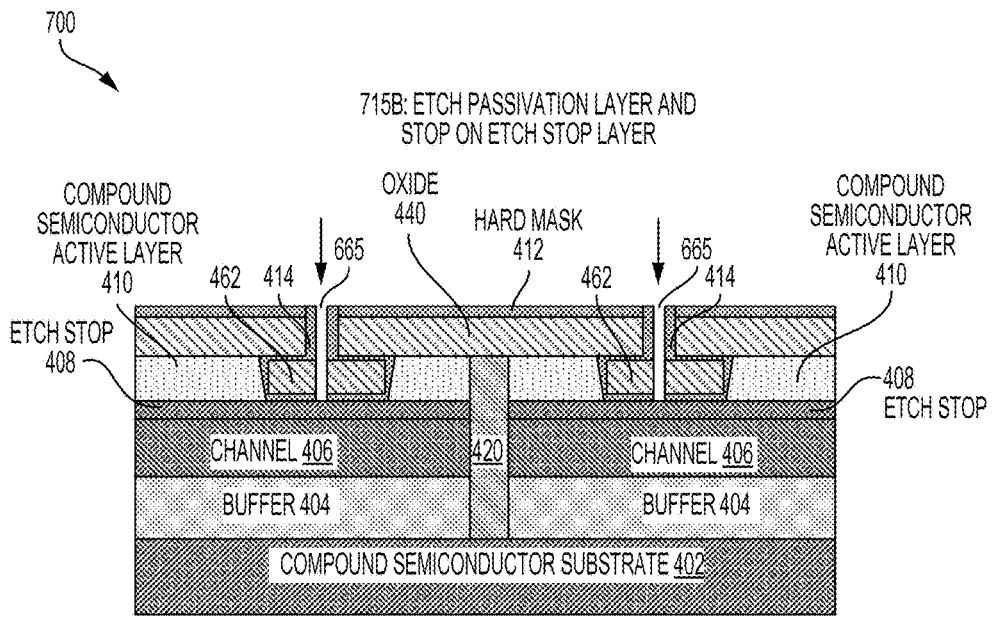
FIGS. 7A-7C illustrate formation of the compound semiconductor field effect transistor (FET) of FIG. 6 according to further aspects of the present disclosure.
Figure 7B:
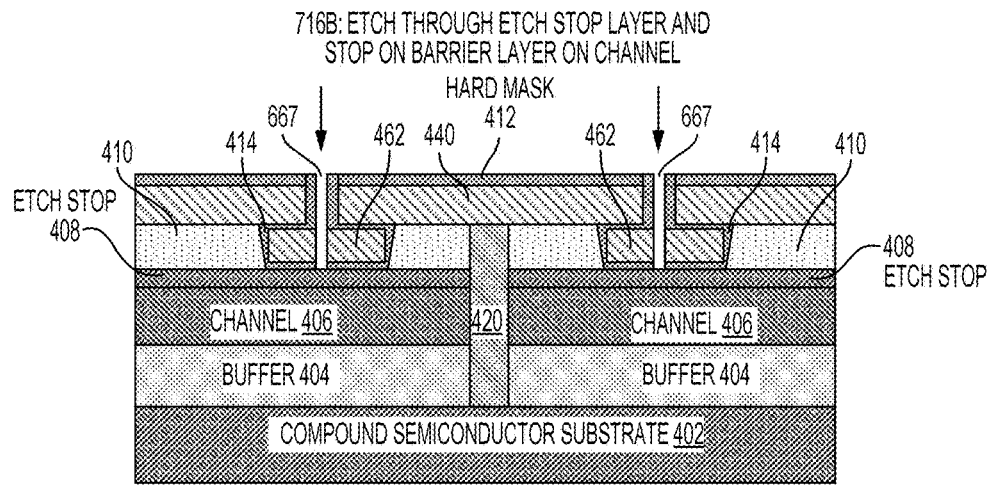
Figure 7C:
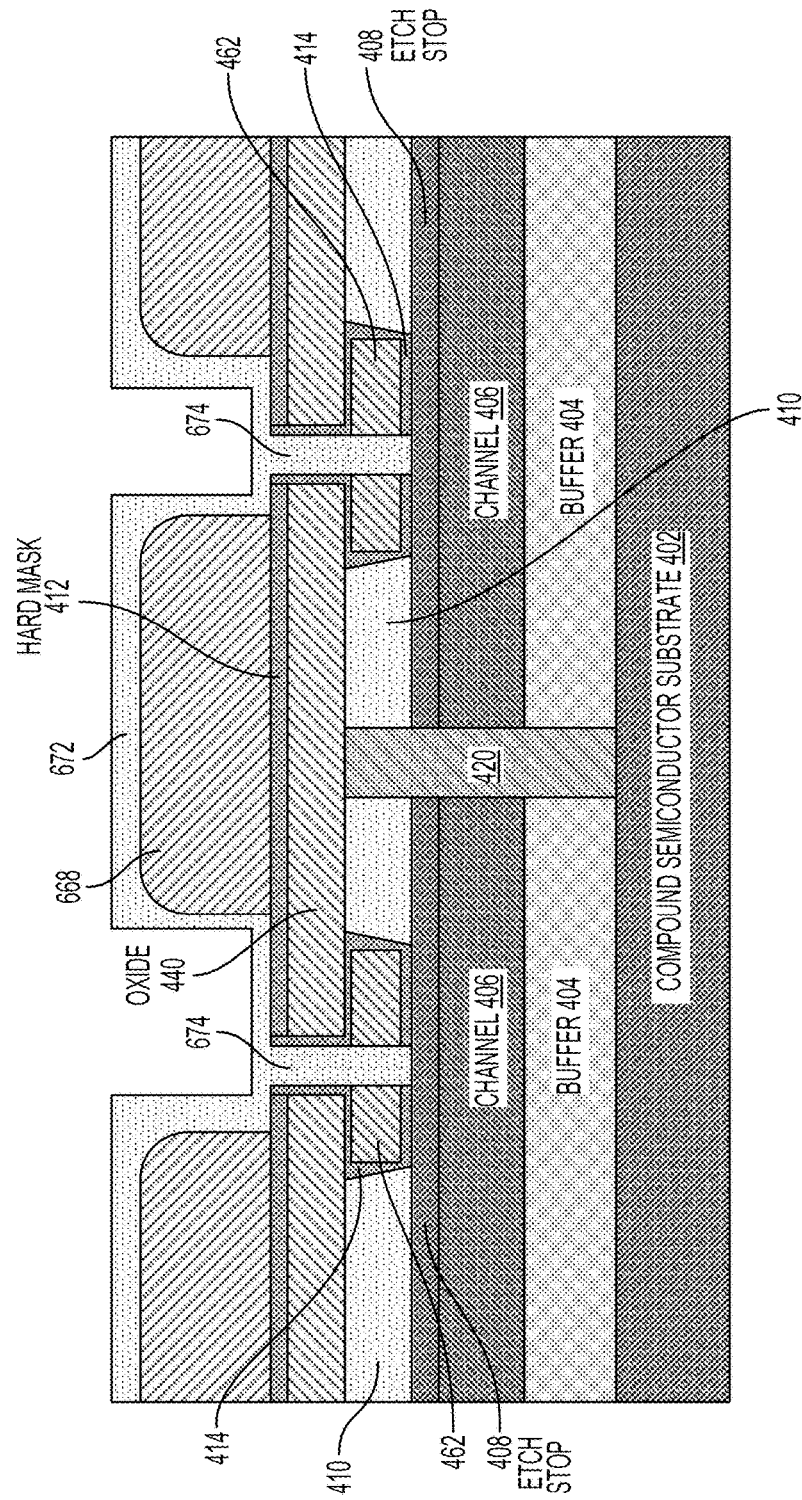
Figure 9A:
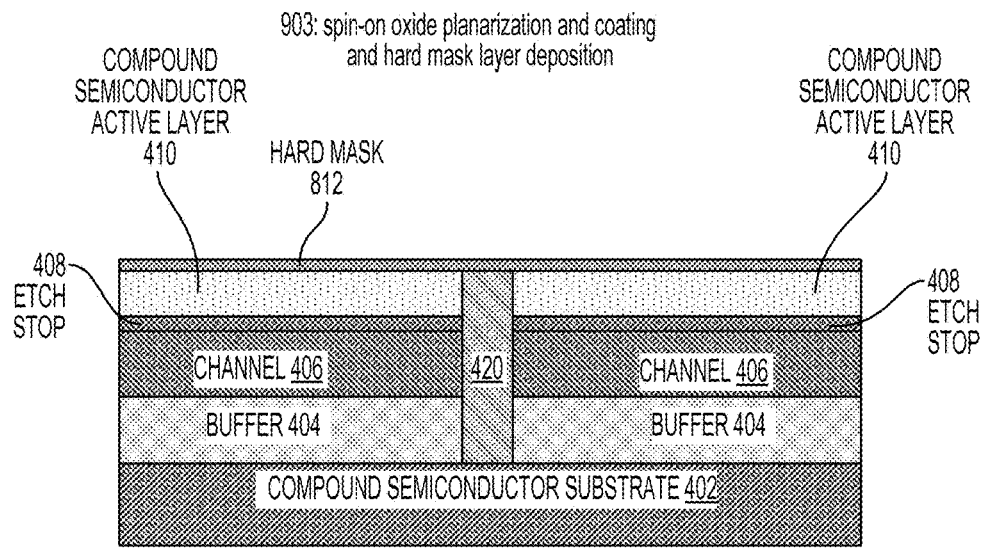
FIGS. 9A-9V illustrate formation of the compound semiconductor field effect transistor (FET) of FIG. 8 according to further aspects of the present disclosure.
Figure 9V:
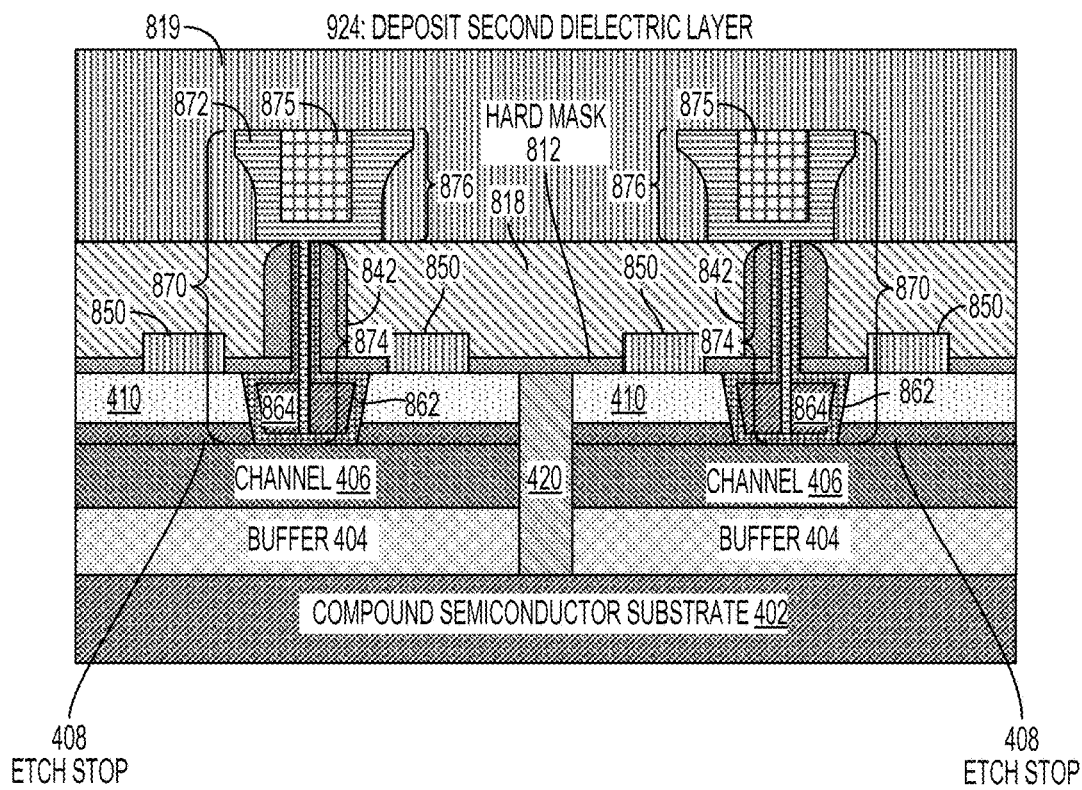
Figure 10:
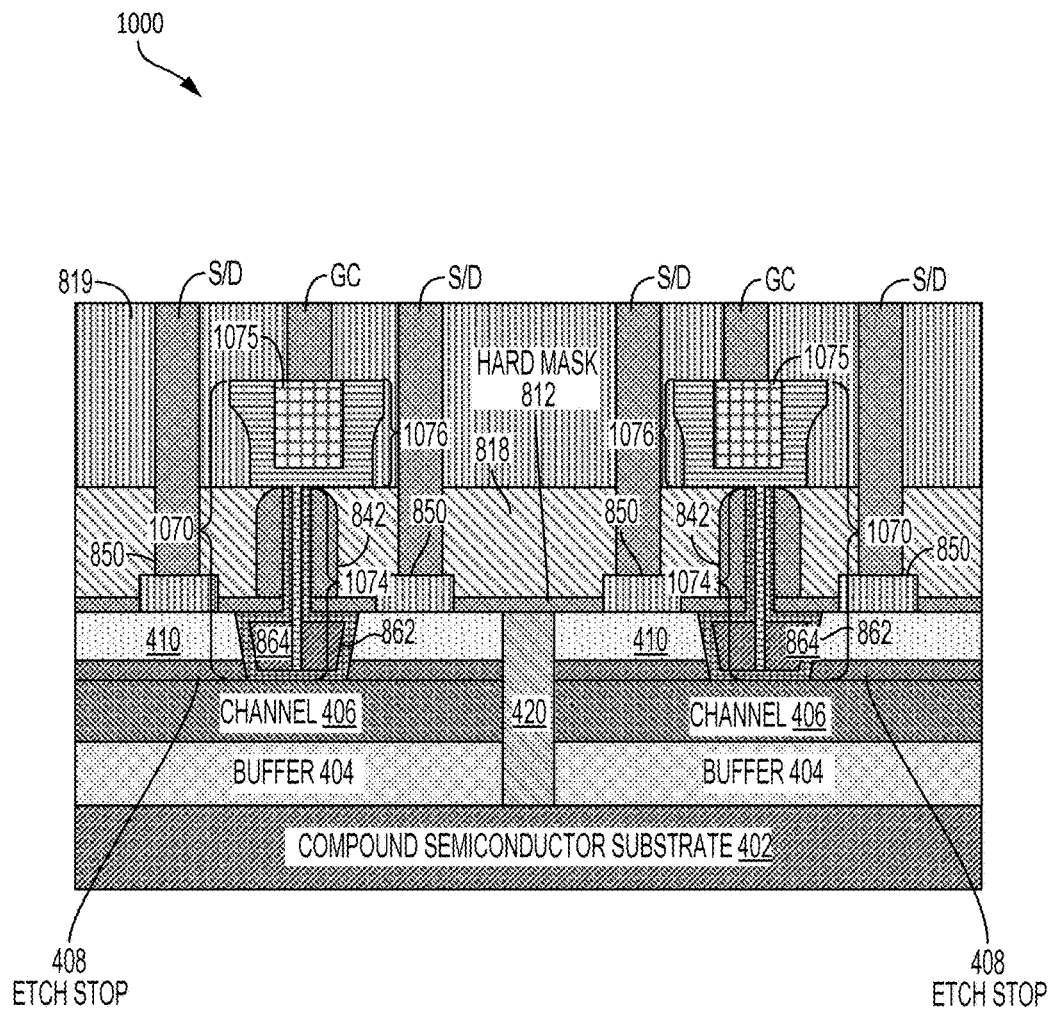
FIG. 10 illustrates a metal oxide semiconductor (MOS) field effect transistor (FET) (MOSFET) having a gate first, self-aligned gate with a reduced gate to source/drain space according to further aspects of the present disclosure.

A self-aligned, gate first process is shown in FIGS. 5A-5P for fabricating a compound semiconductor FET having a self-aligned MOSFET gate, for example, as shown in FIG. 4. According to a further aspect of the present disclosure, an alternative self-aligned, gate first process for fabricating a self-aligned, Schottky gate compound semiconductor FET, as shown in FIG. 6, is illustrated in FIGS. 7A-7C. FIGS. 5A-5N of the self-aligned, gate first process for the MOSFET gate compound semiconductor FET are also part of the fabrication process of the Schottky gate compound semiconductor FET of FIG. 6. FIGS. 9A-9V show a self-aligned, gate first process for fabricating the compound semiconductor FET of FIG. 8 according to a Schottky configuration. FIG. 10 illustrates a self-aligned, gate first compound semiconductor FET according to a MOSFET configuration.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be composed of a compound semiconductor material, such as gallium arsenide (GaAs, InP) or gallium nitride (GaN), a ternary material such as indium gallium arsenide (InGaAs, AlGaAs, InGaSb), quaternary materials (InGaAsP), or any material that can be a substrate material for other compound semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

After the wafer 100 is processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawed or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

After the wafer 100 is separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
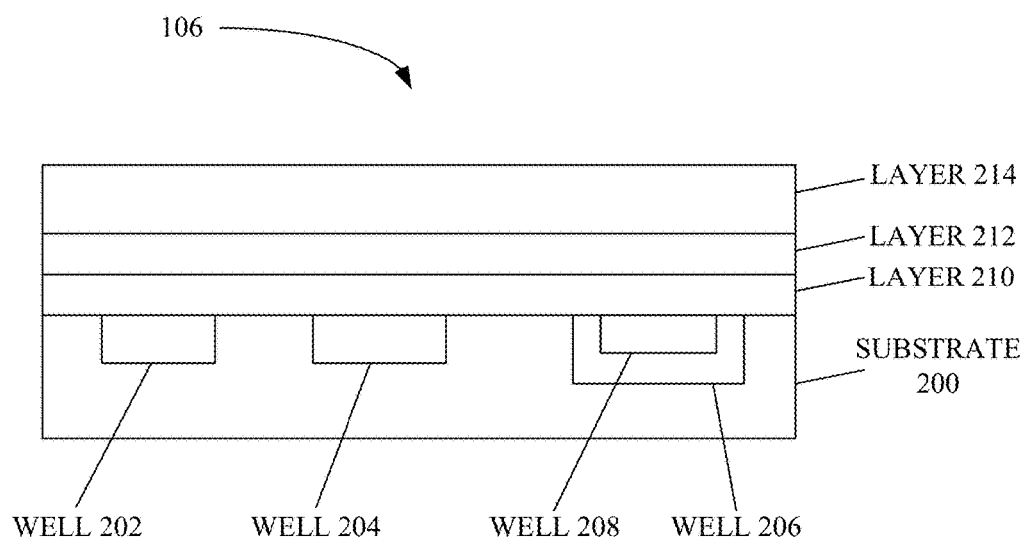
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

The semiconductor substrate may also have a well 206 and a well 208. The well 208 may be completely within the well 206, and, in some cases, may form a bipolar junction transistor (BJT), a heterojunction bipolar transistor (HBT), a high electron mobility transistor (HEMT), a pseudomorphic HEMT (pHEMT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods.

Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers of a radio frequency (RF) front end module, for example, as shown in FIG. 3.

Figure 3:
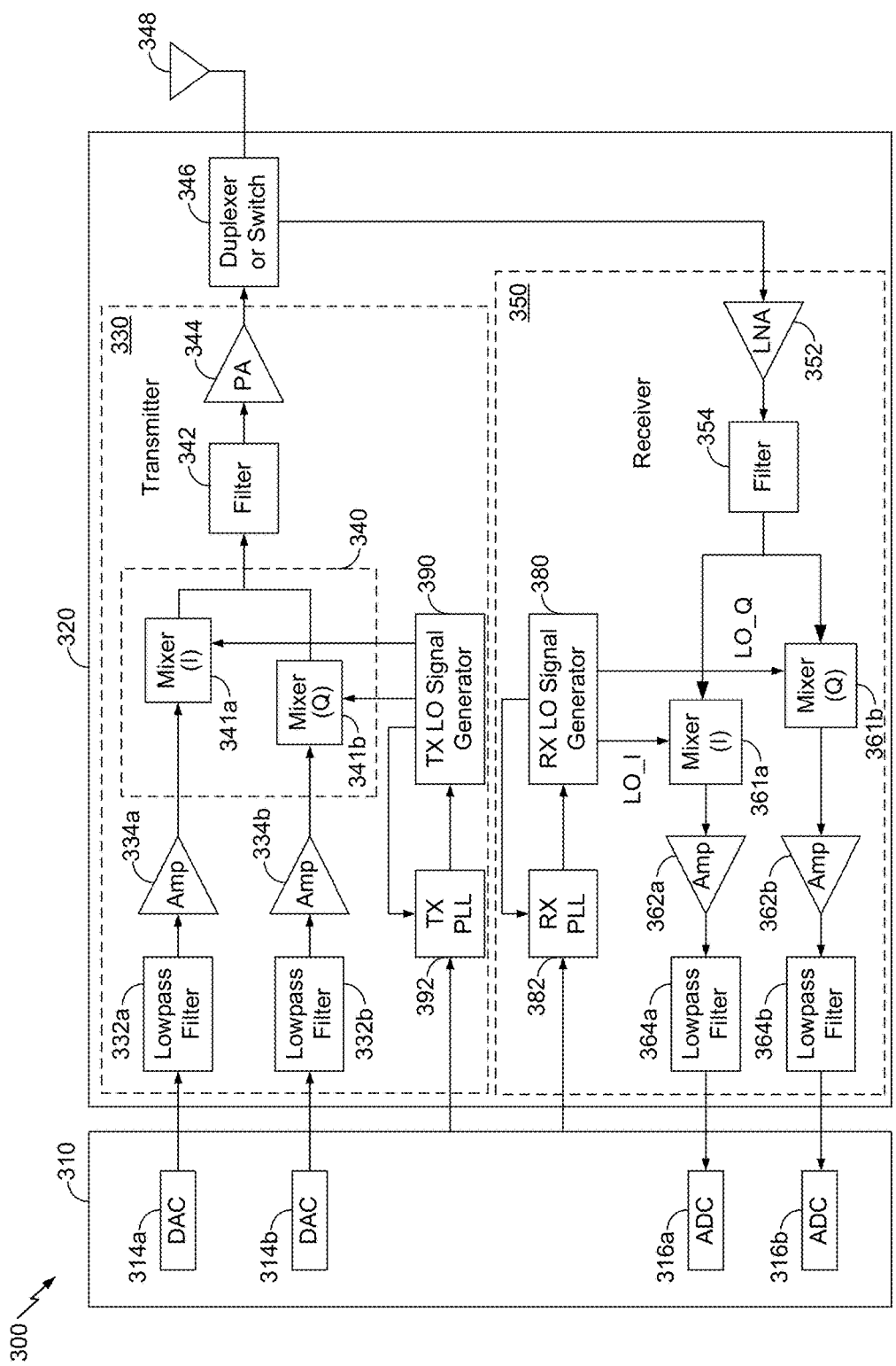
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. Upconversion mixers 341a and 341b of an upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal are generally selected to operate at substantially higher frequencies. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

A high electron mobility transistor (HEMT) is a type of field effect transistor (FET) that relies on a junction between different semiconductor materials with different bandgaps to form a heterojunction, similar to a heterojunction bipolar transistor. A high electron mobility transistor may also use a III-V compound semiconductor material, a II-VI compound semiconductor material, or other like compound semiconductor material, which exhibits high carrier mobility and direct energy gaps. High electron mobility transistors improve upon heterojunction transistors by supporting substantially higher transmission frequencies, which may meet future 5G/5G+ performance specifications.

While heterojunction bipolar transistors and pseudomorphic high electron mobility transistors offer possible solutions to meeting future 5G/5G+ performance specifications, these transistors suffer from gate scaling issues and/or gate alignment issues noted above. For example, conventional compound semiconductor (e.g., GaAs, InP, and GaN) high electron mobility transistors are generally fabricated without self-aligned gates as well as a large gate to source/drain space, which limits device performance. The lack of self-aligned gates may be due to space limitations with regards to conventional processing steps. In addition, compound semiconductor heterojunction bipolar transistors that meet future 5G/5G+ performance specifications rely on compound semiconductor materials that are at least five times more expensive than conventional compound semiconductor materials. Therefore, a desire exists for a self-aligned, gate first process, while reducing the gate to source/drain space to overcome the challenges described above.

Aspects of the present disclosure are directed to an innovative compound semiconductor FET having a gate (e.g., a T-gate) that is self-aligned with a source/drain region. In one arrangement, the gate includes a base gate and a head gate, in which a space between the base gate and a source/drain region may be reduced to a predetermined value (e.g., 20 nanometers). The reduced gate to source/drain space improves device integration density. The reduced space also improves device performance by reducing, for example, parasitic resistance. Such a device and method enables a low cost compound semiconductor FET (e.g., a gallium arsenide (GaAs) pseudomorphic high electron mobility transistor) device for 5G wireless.

A compound semiconductor FET may include a first dielectric layer surrounded by a passivation layer on a channel layer of a compound semiconductor material layer stack. The compound semiconductor FET also includes a second dielectric layer on the first dielectric layer. A gate of the compound semiconductor FET may include a base gate and a head gate. The base gate may extend through the first dielectric layer and the second dielectric layer, and electrically contact the channel layer. In addition, the head gate may be in a third dielectric layer on the second dielectric layer and electrically coupled to the base gate. The gate head may be a T-gate, a gamma gate, or other like gate configuration.

A base gate may extend through an oxide layer that self-aligns the base gate with a source/drain region in a compound semiconductor active layer of the compound semiconductor FET. The base gate may stop on a passivation oxide layer to form a metal oxide semiconductor (MOS) FET (MOSFET) gate compound semiconductor FET, having a reduced gate to source/drain space. A Schottky gate compound semiconductor FET may include a base gate that stops on a channel layer of a compound semiconductor material stack. A self-aligned, gate first process is shown in FIGS. 5A-5P for fabricating a compound semiconductor FET having a self-aligned MOSFET gate, for example, as shown in FIG. 4.

FIG. 4 illustrates a compound semiconductor field effect transistor (FET) 400 having a self-aligned gate with a reduced gate to source/drain space according to aspects of the present disclosure. In this arrangement, the compound semiconductor FET 400 is shown in a self-aligned metal oxide semiconductor (MOS) FET (MOSFET) gate configuration. Representatively, the compound semiconductor FET 400 includes a compound semiconductor substrate 402 (e.g., semi-insulating) that may be composed of silicon gallium arsenide (SiGaAs). A buffer layer 404 is on the compound semiconductor substrate 402. The buffer layer 404, which may be composed of gallium arsenide (GaAs), is grown on the compound semiconductor substrate 402 to isolate defects from the compound semiconductor substrate 402. The buffer layer 404 also provides a smooth surface on which to grow the active layers of the compound semiconductor FET 400, which may be referred to herein as a "compound semiconductor material stack."

The compound semiconductor FET 400 also includes a channel 406, which is generally grown after the buffer layer 404. The channel 406 may be composed of aluminum gallium arsenide (AlGaAs), indium gallium arsenide (InGaAs), or other like compound semiconductor material. A barrier layer (e.g., AlGaAs) may be grown on the channel 406. Ideally, all electron conduction of the compound semiconductor FET 400 should take place in the channel 406. Additional details regarding formation of the channel 406, the barrier layer (not shown), and buffer layer 404 are omitted to avoid obscuring innovative details of the present disclosure.

In aspects of the present disclosure, the compound semiconductor FET 400 includes a MOSFET gate 470 having a base gate 474 that extends through a hard mask 412, a second oxide layer 462, and a first oxide layer 440, stopping on a passivation oxide layer 414. In this arrangement, the passivation oxide layer 414 includes a first portion through an opening in the second oxide layer 462. The passivation oxide layer 414 also includes a second portion that lines a cavity in a compound semiconductor active layer 410 of the compound semiconductor FET 400. The second portion of the passivation oxide layer 414 is also on an etch stop layer 408 to the channel 406. A semiconductor portion of a source/drain region of the compound semiconductor FET 400 may be self-aligned with the base gate 474 according to a recessed gate region.

The compound semiconductor FET 400 includes a head gate 476, which is supported by the first oxide layer 440 and electrically coupled to the base gate 474. The head gate 476 may be a symmetric T-gate, a gamma gate, or other like asymmetric or symmetric gate configuration. The MOSFET gate 470 includes source/drain regions composed of the compound semiconductor active layer 410 (e.g., N+ GaAs). In FIG. 4, dual transistors are shown, separated by an isolation layer 420. Source/drain (S/D) contacts and gate contacts (GC) to the source/drains and gates of the compound semiconductor FET 400 (not shown) are subsequently formed according to a gate first process. A self-aligned, gate first process is shown in FIGS. 5A-5P for fabricating the compound semiconductor FET 400, having the MOSFET gate 470 shown in FIG. 4.

FIG. 5A illustrates a portion of the compound semiconductor FET 400 after step 501 of a self-aligned, gate first process 500 according to aspects of the present disclosure. FIG. 5A shows the compound semiconductor substrate 402 supporting the buffer layer 404 and the channel 406 (e.g., a channel layer), which are epitaxially grown. The etch stop layer 408 (e.g., aluminum arsenide (AlAs)) is shown on the channel 406, supporting the doped (e.g., N+ GaAs) compound semiconductor active layer 410.

FIG. 5B illustrates a portion of the compound semiconductor FET 400 after step 502 of the self-aligned, gate first 500 to form an isolation layer 420 according to aspects of the present disclosure. The isolation layer 420 may be formed by an isolation and implanting process using, for example, a helium implant dose (e.g. 1E14-1E15 cm-2). Following the helium implant, an annealing process (e.g., at 500° C. for approximately 1 minute) forms the isolation layer 420.

FIG. 5C illustrates a portion of the compound semiconductor FET 400 after step 503 of the self-aligned, gate first process 500 to form a first dielectric layer according to aspects of the present disclosure. The first dielectric layer may be a first oxide layer 440, which is formed using a spin-on oxide planarization and coating process. This process may coat the compound semiconductor active layer 410 and the isolation layer 420 with a spin-on oxide that is liquid at room temperature. The spin-on oxide may be subjected to a bake process (e.g., at 400° C. for approximately 10 minutes) to form the first oxide layer 440.

In this arrangement, a hard mask 412 is subsequently formed on the first oxide layer 440. The hard mask 412 may be composed of silicon nitride (SiN) or other like protective layer. The hard mask 412 may be formed by using a plasma enhanced, chemical vapor deposition (PECVD) process. The PECVD process is performed on the first oxide layer 440 to form the hard mask 412 as a silicon nitride layer having a predetermined thickness (e.g., approximately 10 nanometers). According to aspects of the present disclosure, the hard mask 412 provides a mask layer for forming a base gate of, for example, a scaled T-gate using a pattern transfer process described in FIG. 5D.

FIG. 5D illustrates a portion of the compound semiconductor FET 400 after step 504 of the self-aligned, gate first process 500 to form a gate pattern 450 according to aspects of the present disclosure. A thickness of the gate pattern 450 may determine a gate length of a base gate of the compound semiconductor FET 400. The gate pattern 450 may be formed using a plasma enhanced chemical vapor deposition (PECVD) on the hard mask 412. The PECVD process may deposit a silicon germanium (SiGe) layer having a determined thickness (e.g., 25 nanometers to 0.5 microns). In addition, the silicon germanium layer may be substantially composed of germanium (e.g., germanium ≥50%). Once formed, the silicon germanium layer is subjected to a lithography and dry etch to form the gate pattern 450 on the hard mask 412. The greater the thickness of the gate pattern 450, the longer the gate length of a base gate.

FIG. 5E illustrates a portion of the compound semiconductor FET 400 after step 505 of the self-aligned, gate first process 500 to form a spacer material layer 452 according to aspects of the present disclosure. The spacer material layer 452 may also be formed using a plasma enhanced chemical vapor deposition process on the gate pattern 450 and on the hard mask 412. The spacer material layer 452 may be formed by depositing a conformal spacer material, such as amorphous silicon (a-Si) having a predetermined thickness (e.g., in the range of 5 nanometers to 0.15 microns).

FIG. 5F illustrates a portion of the compound semiconductor FET 400 after step 506 of the self-aligned, gate first process 500 to form spacers 454 according to aspects of the present disclosure. The spacers 454 may be formed by subjecting the spacer material layer 452 to a dry etch process to form the spacers 454. In this example, the spacers 454 provide a dummy base gate that is subsequently removed according to a gate replacement process. According to aspects of the present disclosure, a thickness of the spacers 454 is scalable, depending on the thickness of the spacer material layer 452. The thickness of the spacer material layer 452 may range from 2 nanometers to 0.5 microns. A final thickness of the spacers 454 may range from 1 nanometer to 0.25 microns. For a 0.25 micron spacer thickness, the spacers 454 may correspond to an eSiGe thickness of approximately 1.25 microns, with an amorphous silicon (a-Si) thickness of approximately 0.5 microns. For a 1 nanometer spacer thickness, the spacers 454 may correspond to an eSiGe thickness of approximately 10 nanometers, with an amorphous silicon (a-Si) thickness of approximately 2 nanometers.

FIG. 5G illustrates a portion of the compound semiconductor FET 400 after step 507 of the self-aligned, gate first process 500 to complete formation of spacers 454 according to aspects of the present disclosure. The spacers 454 are completed by subjecting the gate pattern 450 to a selective etch, such that the gate pattern 450 is removed and the spacers 454 remain on the hard mask 412. The gate pattern 450 may be removed with a hydrochloric (HCL) wet etch to complete the spacers 454 on the hard mask 412. A temporary dielectric layer is subsequently deposited on the hard mask 412 according to aspects of the present disclosure. The temporary dielectric layer may be a temporary oxide layer 442 (e.g., planarized dielectric layer) that is also formed using a spin-on oxide planarization and coating process. This process may coat the hard mask 412 and sidewalls of the spacers 454 with a spin-on oxide that is liquid at room temperature that is subjected to a bake process (e.g., at 400° C. for approximately 10 minutes) to form the temporary oxide layer 442. The spacers 454 are partially exposed through the temporary oxide layer 442.

FIG. 5H illustrates a portion of the compound semiconductor FET 400 after step 508 of the self-aligned, gate first process 500 to expose the hard mask 412 through the second dielectric layer according to aspects of the present disclosure. The hard mask 412 may be exposed through the temporary oxide layer 442 by subjecting the second oxide layer to a selective etch. The selective etch may be a tetramethylammonium hydroxide (TMAH) etch to form openings 456 in the temporary oxide layer 442.

FIG. 5I illustrates a portion of the compound semiconductor FET 400 after step 509 of the self-aligned, gate first process 500 to form openings in the hard mask 412 and remove the temporary dielectric layer according to aspects of the present disclosure. The hard mask 412 may be subjected to a selective dry etch to form openings 458 in the hard mask 412 exposing the first oxide layer 440. Once formed, the temporary oxide layer 442 is removed by etching the temporary oxide layer 442 and stopping on the hard mask 412.

FIG. 5J illustrates a portion of the compound semiconductor FET 400 after step 510 of the self-aligned, gate first process 500 to form openings in the first oxide layer 440 and the compound semiconductor active layer 410 according to aspects of the present disclosure. The hard mask 412 may be used as a pattern for a selective dry etch of the first oxide layer 440 to form openings 459 in the first oxide layer 440, and expose the compound semiconductor active layer 410. The openings 459 enable the formation of a cavity in the compound semiconductor active layer 410, as further illustrated in FIG. 5K.

FIG. 5K illustrates a portion of the compound semiconductor FET 400 after step 511 of the self-aligned, gate first process 500 to form cavities 460 in the compound semiconductor active layer 410 according to aspects of the present disclosure. The compound semiconductor active layer 410 may be subjected to a selective dry etch to form cavities 460 in the compound semiconductor active layer 410, and expose the etch stop layer 408. That is, the selective dry etch of the compound semiconductor active layer 410 stops on the etch stop layer 408. The cavities 460 may provide a recessed gate region that enables self-alignment between the base gate 474 and subsequently formed source/drain regions.

FIG. 5L illustrates a portion of the compound semiconductor FET 400 after step 512 of the self-aligned, gate first process 500 to form a passivation oxide layer in the cavities 460 in the compound semiconductor active layer 410 according to aspects of the present disclosure. Representatively, a conformal layer may be deposited in the openings 459 in the hard mask 412 and the first oxide layer 440 as well as the cavities 460 in the compound semiconductor active layer 410 and on the etch stop layer 408 to form a passivation oxide layer 414. In this aspect of the present disclosure, the passivation oxide layer 414 enables formation of a MOSFET gate compound semiconductor FET.

FIG. 5M illustrates a portion of the compound semiconductor FET 400 after step 513 of the self-aligned, gate first process 500 to form a second oxide layer in the cavities 460 of the compound semiconductor active layer 410 according to aspects of the present disclosure. Representatively, a second dielectric layer is deposited on the passivation oxide layer 414 that lines the openings 459 in the hard mask 412 and the first oxide layer 440. The second dielectric layer is also deposited on the passivation oxide layer 414 that lines the cavities 460 in the compound semiconductor active layer 410 to form a second oxide layer 462. The second oxide layer 462 may be formed by filling the cavities 460 with a spin-on oxide subjected to a bake process to form the second oxide layer 462 surrounded by the passivation oxide layer 414 in a recessed gate region. In this arrangement, the recessed gate region is defined by the cavities 460.

FIG. 5N illustrates a portion of the compound semiconductor FET 400 after step 514 of the self-aligned, gate first process 500 to form openings 464 through the second oxide layer 462 in a recessed gate according to aspects of the present disclosure. In this configuration, the second oxide layer 462 is etched to expose the passivation oxide layer 414 at a base of the cavities 460 (FIG. 5K) in the compound semiconductor active layer 410. The openings 464 define a structure of a self-aligned base gate according to aspects of the present disclosure. In this manner, a source/drain region at an edge of the recessed gate regions (e.g., cavities 460) is self-aligned with the base gate.

Once the openings 464 are formed, the self-aligned, gate first process 500 may vary depending on whether a MOSFET gate compound semiconductor FET or a Schottky gate compound semiconductor FET is formed. The MOSFET gate 470 compound semiconductor FET 400 of FIG. 4 is formed using steps 515a to 516a of the self-aligned, gate first process shown in FIGS. 5O-5P. A Schottky gate compound semiconductor FET of FIG. 6 is formed using steps 715b to 718b of the self-aligned, gate first process, as shown in FIGS. 7A-7C.

FIG. 5O illustrates a portion of the compound semiconductor FET 400 after step 515a of the self-aligned, gate first process 500 to deposit a first gate material 472 of a MOSFET T-gate according to aspects of the present disclosure. An atomic layer deposition (ALD) process may deposit the first gate material 472 in the openings 464 (FIG. 5N), on the hard mask 412, and on a first resist layer 467. For example, the first gate material 472 may be sputtered to fill the openings 464 (FIG. 5N). A portion of the first gate material 472 on the hard mask 412 and the first resist layer 467 may provide a seed layer for a second gate material. The first gate material 472 may be titanium nitride (TiN), tungsten silicon nitride (WSiN), or other like conductive gate material. Once filled in the openings 464 (FIG. 5N), the first gate material 472 forms a base gate 474 of, for example, a MOSFET T-gate according to aspects of the present disclosure.

FIG. 5P illustrates a portion of the compound semiconductor FET 400 after step 516a of the self-aligned, gate first process 500 to form a MOSFET gate 470 according to aspects of the present disclosure. A second resist layer 469 is deposited and patterned on portions of the first gate material 472 according to the predetermined configuration of a MOSFET T-gate according to aspects of the present disclosure. In this case, the arrangement of the second resist layer 469 determines the shape of a head gate of the MOSFET T-gate. For example, a plating process may be performed to deposit the second gate material on the first gate material 472 and sidewalls of the second resist layer 469. The second gate material may be gold (Au), or other like conductive gate material, to form a head gate 476 of the MOSFET gate 470 (FIG. 4).

In this arrangement, the head gate 476 is supported by the hard mask 412 and the first oxide layer 440. In addition, the base gate 474 extends through the hard mask 412 and the first oxide layer 440, stopping on the passivation oxide layer 414. The base gate 474 may electrically contact the channel 406 through the passivation oxide layer 414 and the etch stop layer. The configuration of the MOSFET gate 470 may improve a breakdown voltage of the compound semiconductor FET 400, while reducing a parasitic resistance due to a reduced gate to source/drain space. Reducing the parasitic resistance of the compound semiconductor FET 400 also improves a transmission frequency/maximum frequency (Ft/Fmax). According to aspects of the present disclosure, removing the passivation oxide layer 414 prevents formation of the MOSFET gate 470 shown in FIG. 4. That is, removal of the passivation oxide layer 414 enables formation of a Schottky gate compound semiconductor FET, for example, as shown in of FIG. 6.

FIG. 6 illustrates a compound semiconductor FET 600 including a self-aligned Schottky gate having a reduced gate to source/drain space according to aspects of the present disclosure. In this arrangement, the compound semiconductor FET 600 is shown in a scaled Schottky gate configuration. In contract to the MOSFET gate compound semiconductor FET of FIG. 4, a base gate 674 of the Schottky gate compound semiconductor FET of FIG. 6 extends through the passivation oxide layer 414 and the etch stop layer 408, stopping on the channel 406. A configuration of the first gate material 672, a first resist layer 668, a second resist layer 669, and a head gate 676 of a Schottky gate 670 may be similar to the configuration shown in FIG. 4. A self-aligned, gate first process 700 of forming the compound semiconductor FET 600 also includes steps 501-514, as shown in FIGS. 5A-5N. The self-aligned, gate first process 700 continues at FIG. 7A.

FIG. 7A illustrates a portion of the compound semiconductor FET 600 after step 715b of the self-aligned, gate first process 700 to form openings 665 in the passivation oxide layer 414 according to aspects of the present disclosure. Representatively, the passivation oxide layer 414 is etched to expose the etch stop layer 408. Removing the passivation oxide layer 414 prevents formation of the MOSFET gate 470 shown in FIG. 4. That is, removal of the passivation oxide layer 414 enables formation of the compound semiconductor FET 600 of FIG. 6, according to a Schottky gate configuration.

FIG. 7B illustrates a portion of the compound semiconductor FET 600 after step 716b of the self-aligned, gate first process 700 to form openings 667 in the etch stop layer 408 according to aspects of the present disclosure. The etch stop layer 408 may be subjected to a selective wet etch to form openings 667 (e.g., an elongated base gate opening) in the etch stop layer 408 exposing the channel 406. In this example, etching of the etch stop layer 408 to form the openings 667 may stop on a barrier layer (not shown) that is on the channel 406. The barrier layer may be composed of aluminum gallium arsenide (AlGaAs).

FIG. 7C illustrates a portion of the compound semiconductor FET 600 after step 717b of the self-aligned, gate first process 700, in which a first gate material 672 of a Schottky gate 670 is deposited according to aspects of the present disclosure. A first resist layer 668 is initially deposited and patterned on portions of the hard mask 412 according to a predetermined configuration of the Schottky gate 670. Next, an atomic layer deposition (ALD) process may be performed to deposit the first gate material 672 in the openings 667, on the hard mask 412, and on the first resist layer 668. A portion of the first gate material 672 on the hard mask 412 and the first resist layer 668 may provide a seed layer for a second gate material. The first gate material 672 may also be titanium nitride (TiN), tungsten silicon nitride (WSiN), or other like conductive gate material. Once deposited in the openings 667, the first gate material 672 forms a base gate 674 (e.g., an extended base gate) of, for example, the Schottky gate 670 according to aspects of the present disclosure.

Referring again to FIG. 6, a portion of the compound semiconductor FET 600 is illustrated after step 718b of the self-aligned, gate first process 700 to form a head gate 676 according to aspects of the present disclosure. In this example, a second resist layer 669 is deposited and patterned on portions of the first gate material 672 according to the predetermined configuration of the Schottky gate 670. A plating process may be performed to deposit the second gate material on the first gate material 672 and sidewalls of the second resist layer 669. The second gate material may be gold (Au), or other like conductive gate material, to enable formation of a head gate 676 of the Schottky gate 670 according to aspects of the present disclosure.

Figure 8:
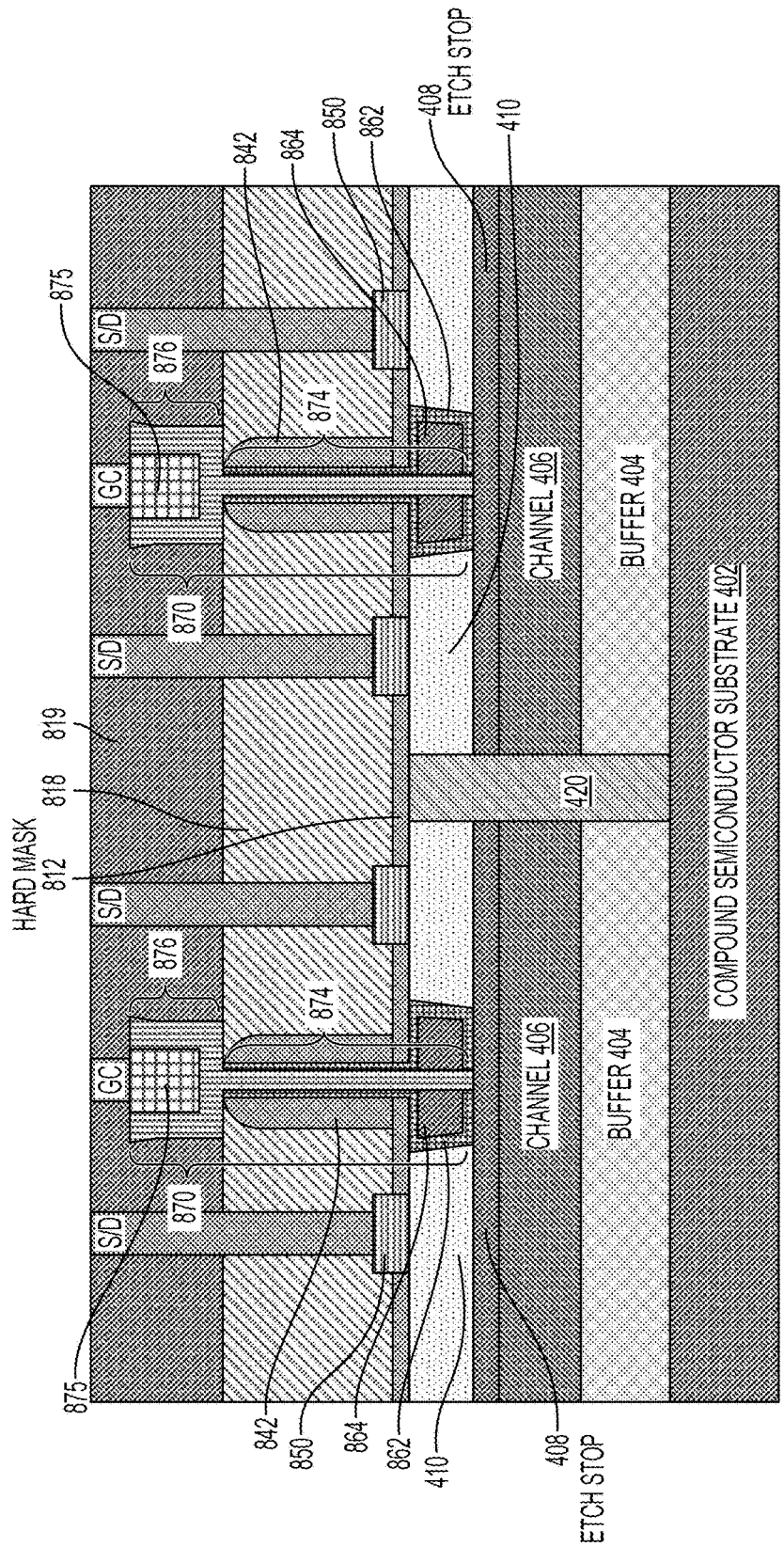
FIG. 8 illustrates a compound semiconductor field effect transistor (FET) having a gate first, self-aligned gate with a reduced gate to source/drain space according to further aspects of the present disclosure.

FIG. 8 illustrates a compound semiconductor field effect transistor (FET) 800 having a self-aligned gate with a reduced gate to source/drain space according to aspects of the present disclosure. In this arrangement, the compound semiconductor FET 800 is shown in a self-aligned Schottky gate configuration. Representatively, a compound semiconductor material stack of the compound semiconductor FET 800 may be similar to the compound semiconductor material stack of the compound semiconductor FET 600, shown in FIG. 6. Accordingly, like reference numbers are re-used to identify corresponding portions of the material stack. In this arrangement, however, the compound semiconductor FET 800 includes a single oxide layer in a recessed gate region.

In aspects of the present disclosure, the compound semiconductor FET 800 includes T-gates 870 having a base gate 874 that extends through a pair of gate spacers 842, and along the hard mask 412 and an oxide layer 864 lined by a passivation layer 862. The base gate 874 also extends through a portion of the passivation layer 862 on the channel 406. The passivation layer 862 includes a first portion lining the opening through the pair of gate spacers 842 in a first dielectric layer 818. The passivation layer 862 also includes a second portion that lines the cavities 860 (e.g., a recessed gate region in FIG. 9O) in the compound semiconductor active layer 410. The second portion of the passivation layer 862 is also on the channel 406 through the etch stop layer 408. The base gate 874 may be self-aligned with a source/drain region of the compound semiconductor FET 800, for example, proximate (e.g., below) ohmic contacts 850 on the compound semiconductor active layer 410.

The compound semiconductor FET 800 includes head gates 876, which are supported by the pair of gate spacers 842 in the first dielectric layer 818 and electrically coupled to the base gate 874. The T-gates 870 include source/drain regions composed of a compound semiconductor active layer 410 (e.g., N+ GaAs). For example, the source/drain regions may be adjacent to the ohmic contacts 850. In this arrangement, dual transistors are shown as separated by the isolation layer 420. Source/drain (S/D) contacts and gate contacts (GC) to the ohmic contacts 850 on the source/drain regions and gates of the compound semiconductor FET 800 are also shown. The source/drain regions may be subsequently formed according to a gate first process. A self-aligned, gate first process is shown in FIGS. 9A to 9V for fabricating the compound semiconductor FET 800, for example, as shown in FIG. 8.

FIG. 9A illustrates a portion of the compound semiconductor FET 800 after step 903 of a self-aligned, gate first process 900 to form a hard mask 812 according to aspects of the present disclosure. Steps 901 and 902 may be performed according to steps 501 and 502, as shown in FIGS. 5A and 5B. At step 903, the hard mask 812 is subsequently formed on the compound semiconductor active layer 410. The hard mask 812 may be composed of similar materials using similar processes to those described in reference to the hard mask 412 shown in FIG. 5C. The hard mask 812 beneficially provides a mask layer for forming a base gate of, for example, a scaled T-gate using, for example, a pattern transfer process, as is further described in FIG. 9B.

Figure 9B:
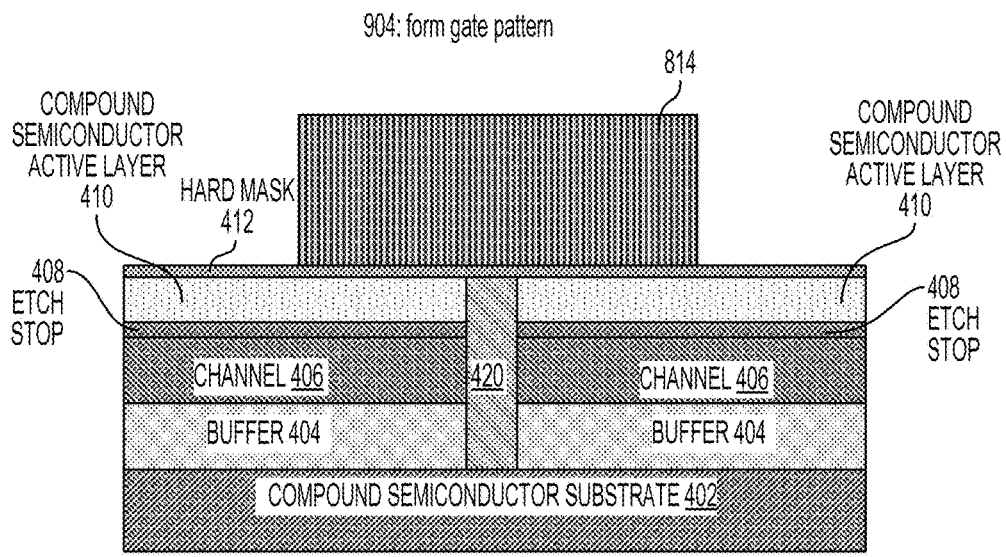

FIG. 9B illustrates a portion of the compound semiconductor FET 800 after step 904 of the self-aligned, gate first process 900 to form a lithographic gate pattern 814 according to aspects of the present disclosure. A thickness of the lithographic gate pattern 814 also determines a gate length of a base gate of the compound semiconductor FET 800. The lithographic gate pattern 814 may be formed using similar processes and similar materials to those described with reference to the gate pattern 450 shown in FIG. 5D. It should be recognized that the greater the thickness of the lithographic gate pattern 814, the longer the gate length of the base gate.

Figure 9C:
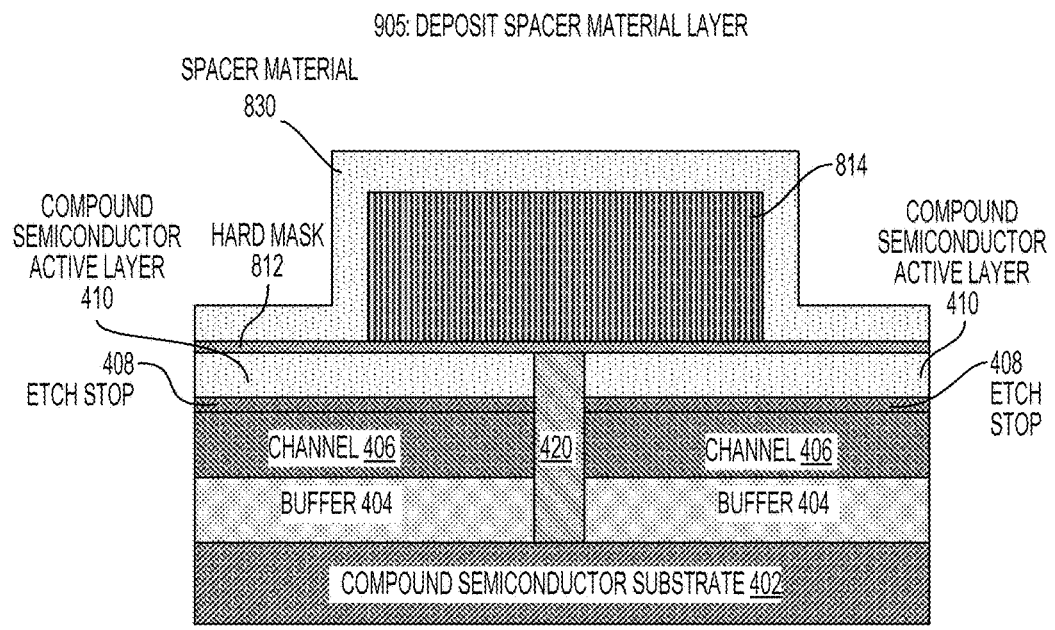

FIG. 9C illustrates a portion of the compound semiconductor FET 800 after step 905 of the self-aligned, gate first process 900 to form a spacer material layer 830 according to aspects of the present disclosure. The spacer material layer 830 is also formed on the lithographic gate pattern 814 and on the hard mask 812. The spacer material layer 830 may be formed using similar materials and process described with reference to the spacer material layer 452 shown in FIG. 5E.

Figure 9D:
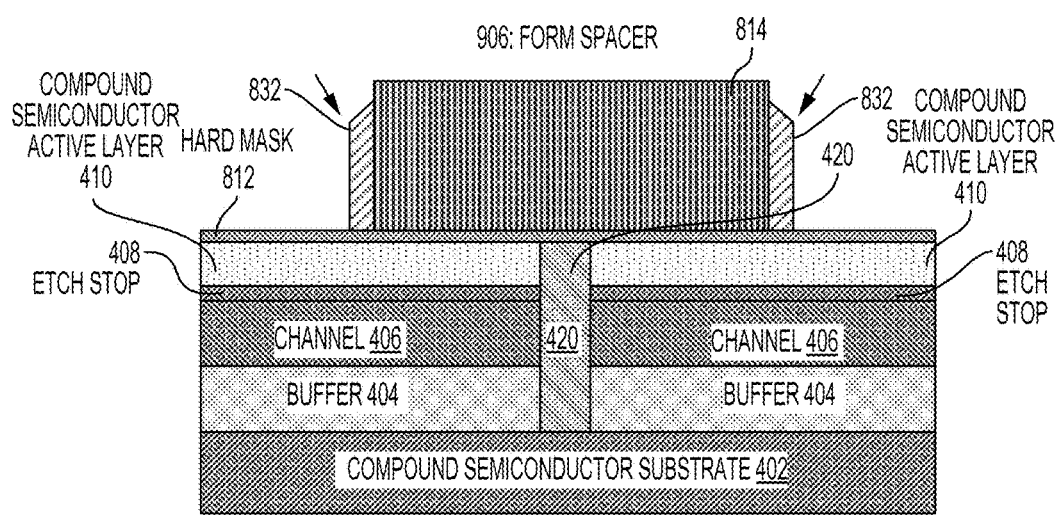

FIG. 9D illustrates a portion of the compound semiconductor FET 800 after step 906 of the self-aligned, gate first process 900 to form spacers 832 according to aspects of the present disclosure. The spacers 832 may be formed by subjecting the spacer material layer 830 to a dry etch process. The thickness of the spacer material layer 830 may range from approximately 2 nanometers to 0.5 microns. A final thickness of the spacers 832 may range from 1 nanometer to 0.25 microns. The dimensions, materials, and processes used to form the spacers may be similar to those described in regards to the spacers 454 shown in FIG. 5F. The thickness of the spacer layer defines the size/thickness of the gate.

Figure 9E:
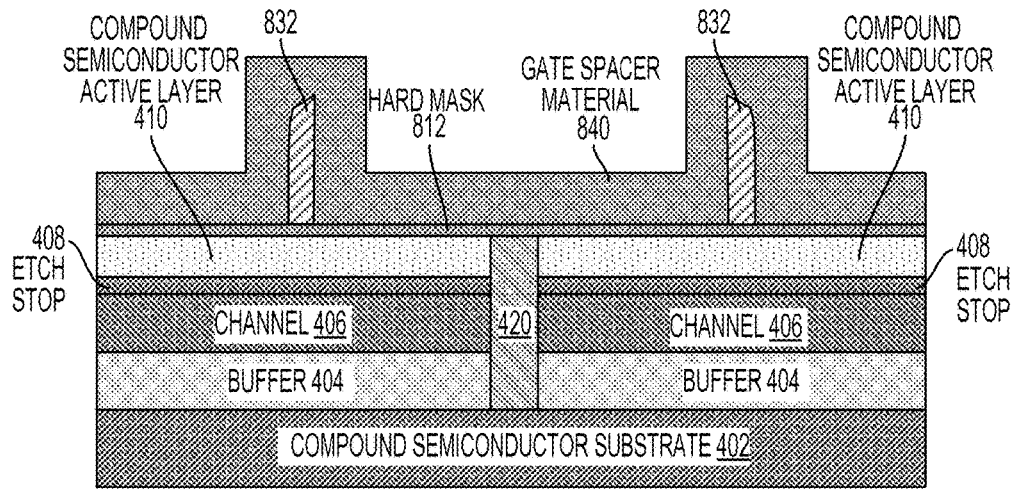

FIG. 9E illustrates a portion of the compound semiconductor FET 800 after step 907 of the self-aligned, gate first process 900 to complete formation of spacers 832 according to aspects of the present disclosure. The spacers 832 are completed by subjecting the lithographic gate pattern 814 to a selective etch, such that the lithographic gate pattern 814 is removed and the spacers 832 remain on the hard mask 812. According to aspects of the present disclosure, the spacers 832 may be dummy base gates that are removed as part of a gate replacement process.

A gate spacer material 840 is subsequently deposited on the hard mask 812. The gate spacer material 840 may be composed of silicon oxynitride (SiON) or silicon oxynitride carbon (SiONC) deposited using a conformal, low temperature (e.g., <450° C.) process. A thickness of the gate spacer material 840 may be in the range of 10 nanometers to 150 nanometers. This process may coat the hard mask 812 and the spacers 832 to form a layer of the gate spacer material 840.

Figure 9F:
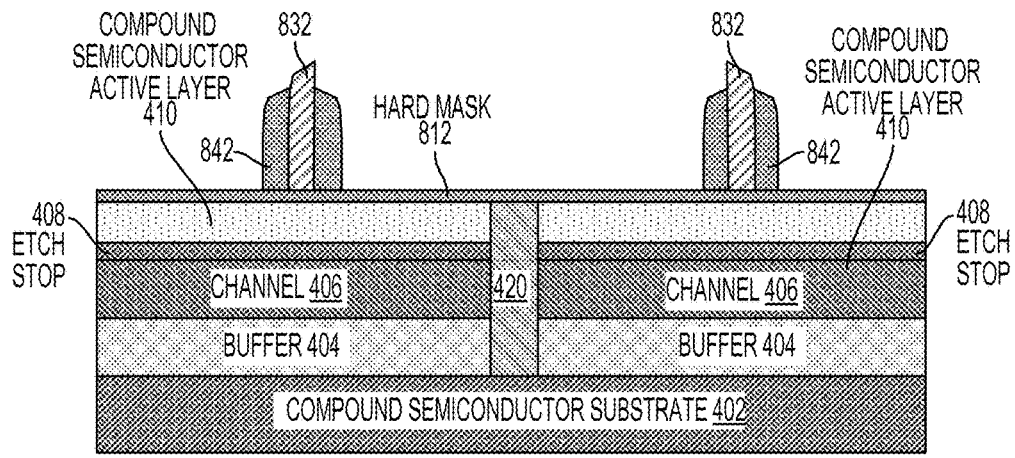

FIG. 9F illustrates a portion of the compound semiconductor FET 800 after step 908 of the self-aligned, gate first process 900 to expose the spacers 832 through a pair of gate spacers 842 according to aspects of the present disclosure. In this example, the gate spacer material 840 is subjected to a dry etch process to form the pair of gate spacers 842. This process stops on the hard mask 812, but does not affect the spacers 832, which protrude from the pair of gate spacers 842. A thickness of the pair of gate spacers 842 may be in the range of 5 nanometers to 100 nanometers.

Figure 9G:
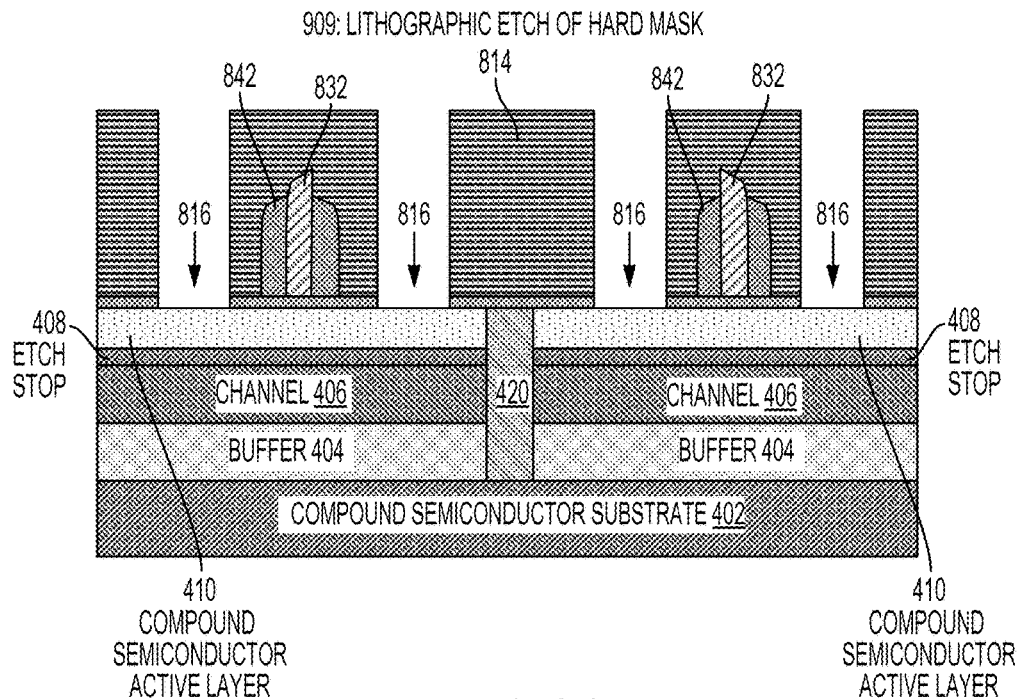

FIG. 9G illustrates a portion of the compound semiconductor FET 800 after step 909 of the self-aligned, gate first process 900 to form openings 816 in the hard mask 812 and expose portions of the compound semiconductor active layer 410 according to aspects of the present disclosure. A lithographic gate pattern 814 may be deposited on the hard mask 812 as well as the spacers 832 and the pair of gate spacers 842. Exposed portions of the hard mask 812 may be subjected to a lithographic etch to form the openings 816 in the hard mask 812 exposing portions of the compound semiconductor active layer 410. The spacers 832 and the pair of gate spacers 842 are protected during the lithographic etch of the hard mask 812.

Figure 9H:
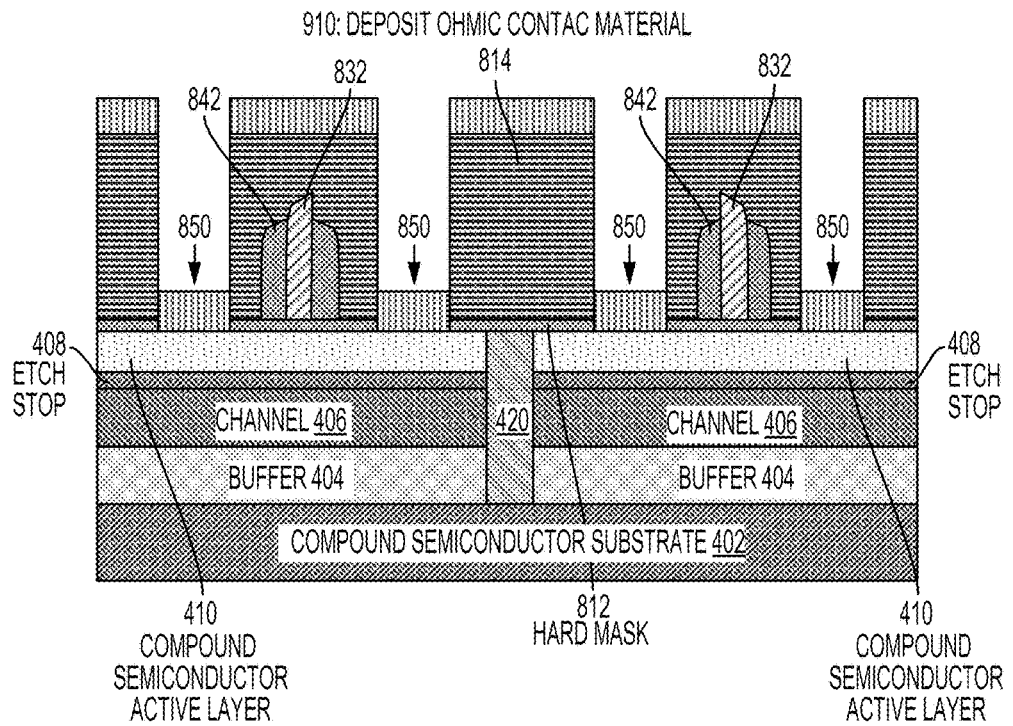

FIG. 9H illustrates a portion of the compound semiconductor FET 800 after step 910 of the self-aligned, gate first process 900 to form ohmic contacts 850 to source/drain regions of the compound semiconductor active layer according to aspects of the present disclosure. The ohmic contacts 850 may be formed using a contact lithography deposition on the exposed portions of compound semiconductor active layer 410 and the lithographic gate pattern 814. The ohmic contacts 850 may form a portion of the source/drain regions of the compound semiconductor FET 800.

Figure 9I:
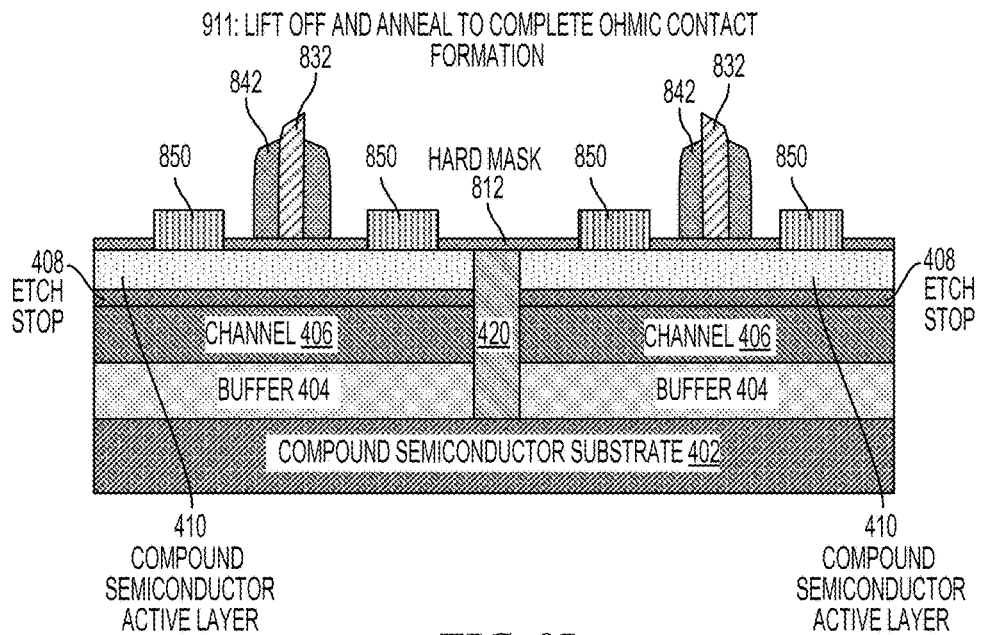

FIG. 9I illustrates a portion of the compound semiconductor FET 800 after step 911 of the self-aligned, gate first process 900 to complete formation of the ohmic contacts 850 according to aspects of the present disclosure. The lithographic gate pattern 814 is first removed. Once removed, a lift-off and ohmic anneal process (e.g., at 425° C. for approximately 1 minute) may complete formation of the ohmic contacts 850. As noted above, the ohmic contacts 850 may form a portion of the source/drain regions of the compound semiconductor FET 800.

Figure 9J:
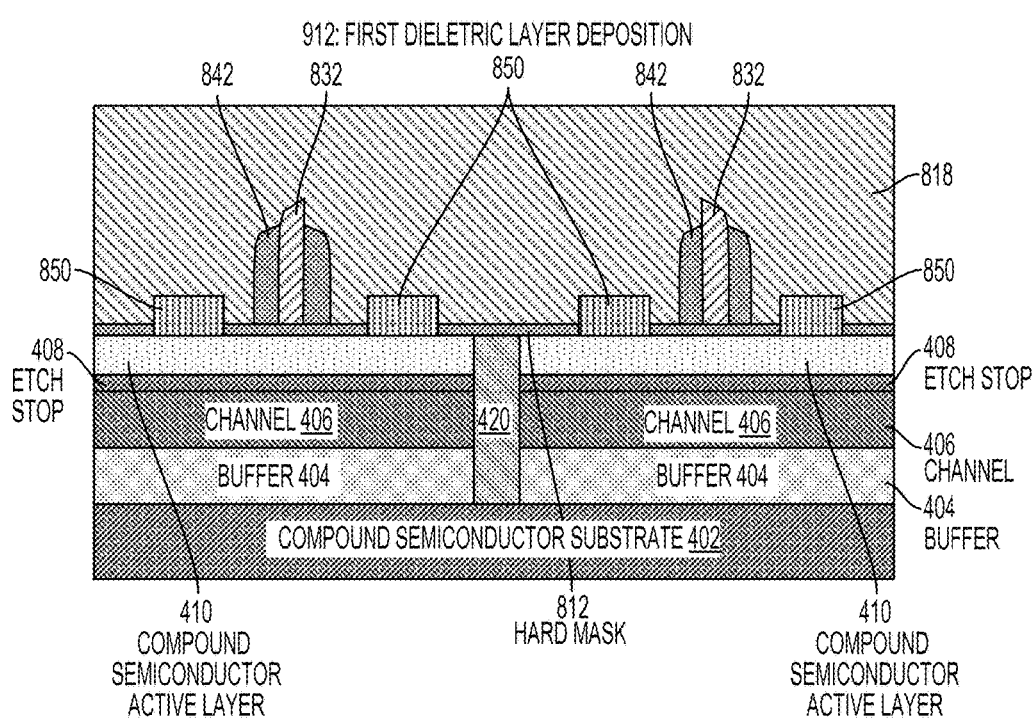

FIG. 9J illustrates a portion of the compound semiconductor FET 800 after step 912 of the self-aligned, gate first process 900 to form a first dielectric layer 818 according to aspects of the present disclosure. The first dielectric layer 818 is formed on a surface of the hard mask 812, the ohmic contacts 850, the spacers 832 and the pair of gate spacers 842. The first dielectric layer 818 covers the spacers 832 and the pair of gate spacers 842. The first dielectric layer 818 may be formed by using a deposition process of silicon nitride (SiN), silicon oxynitride (SiON), silicon oxynitride carbon (SiONC), or other like dielectric material.

Figure 9K:
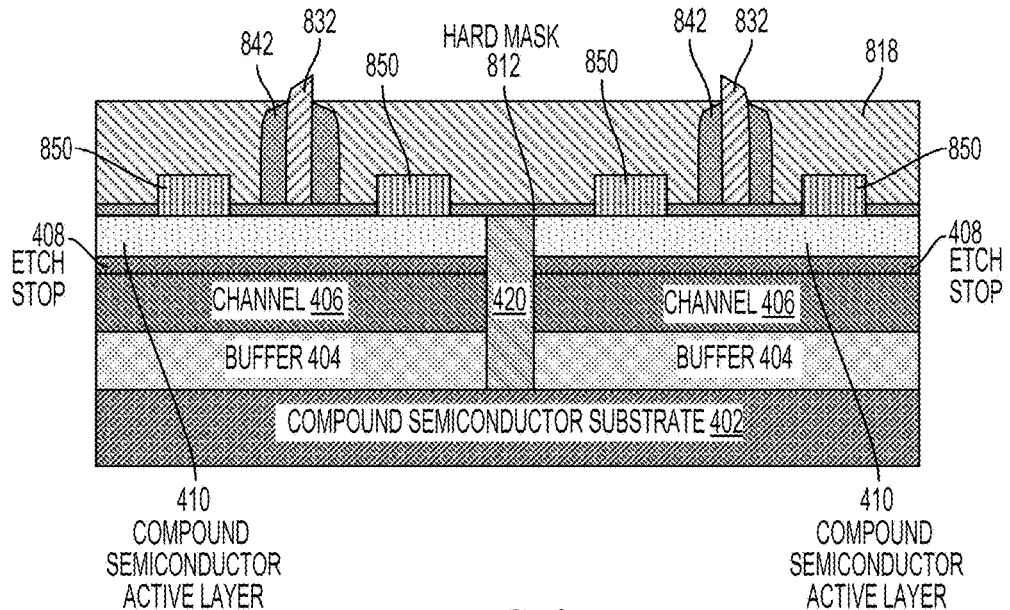

FIG. 9K illustrates a portion of the compound semiconductor FET 800 after step 913 of the self-aligned, gate first process 900 to expose a portion of the spacers 832 through the first dielectric layer 818 according to aspects of the present disclosure. The first dielectric layer 818 may be subjected to a blanket dry etch to expose a portion of the spacers 832 through the first dielectric layer 818. In this example, the spacers 832 provide a dummy base gate that protrudes from the pair of gate spacers 842. A gate replacement process of forming a base gate of the compound semiconductor FET 800 begins in FIG. 9L.

Figure 9L:
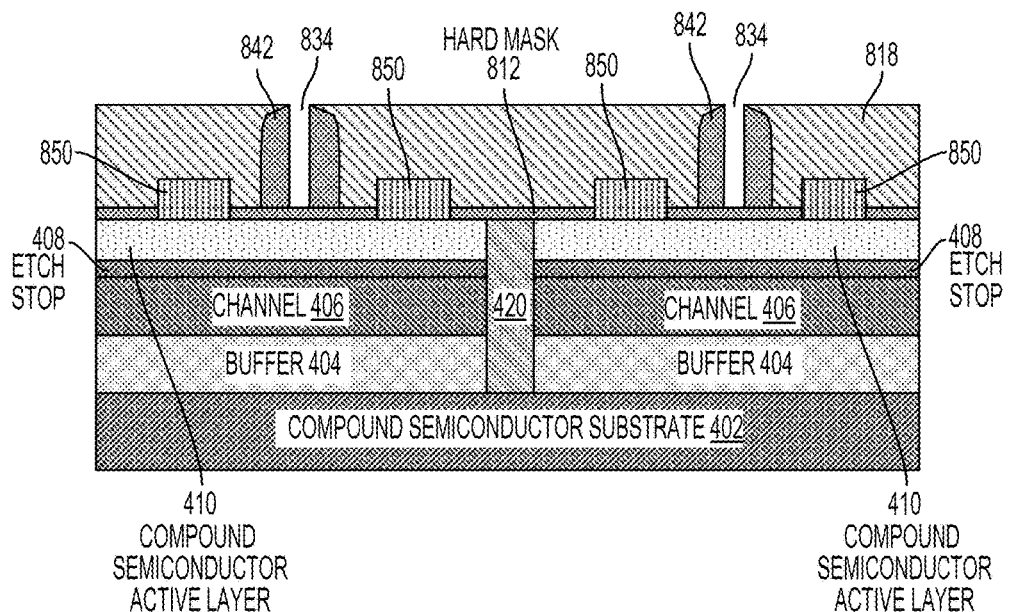

FIG. 9L illustrates a portion of the compound semiconductor FET 800 after step 914 of the self-aligned, gate first process 900 to expose the hard mask 812 through the pair of gate spacers 842 in the first dielectric layer 818 according to aspects of the present disclosure. The hard mask 812 may be exposed through the pair of gate spacers 842 by subjecting the spacers 832 (e.g., dummy base gates) to a selective wet etch. The selective wet etch may be a tetramethylammonium hydroxide (TMAH) etch to form openings 834 (e.g., gate spacer openings) through the pair of gate spacers 842 to expose portions of the hard mask 812.

Figure 9M:
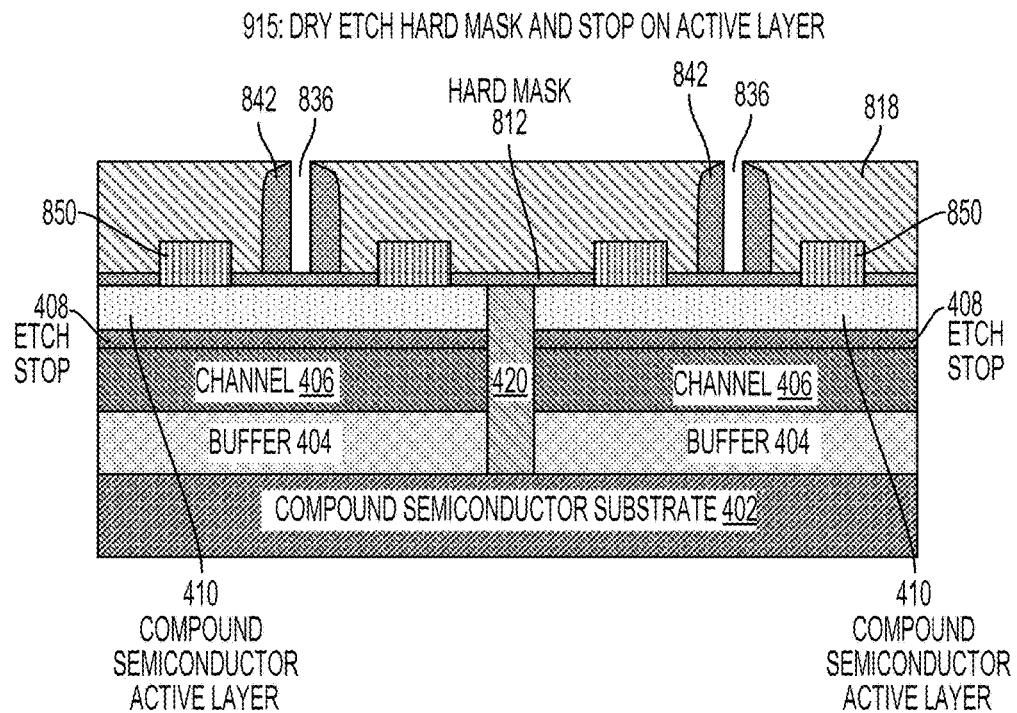

FIG. 9M illustrates a portion of the compound semiconductor FET 800 after step 915 of the self-aligned, gate first process 900 to form openings 836 in the hard mask 812 according to aspects of the present disclosure. The hard mask 812 may be subjected to a selective dry etch to form the openings 836 in the hard mask 812 exposing the compound semiconductor active layer 410. Once formed, the openings 836 in the hard mask 812 enable formation of a recessed gate region in the compound semiconductor active layer 410. For example, the openings 836 in the hard mask 812 enable formation of cavities in the compound semiconductor active layer 410, as further illustrated in FIG. 9N.

Figure 9N:
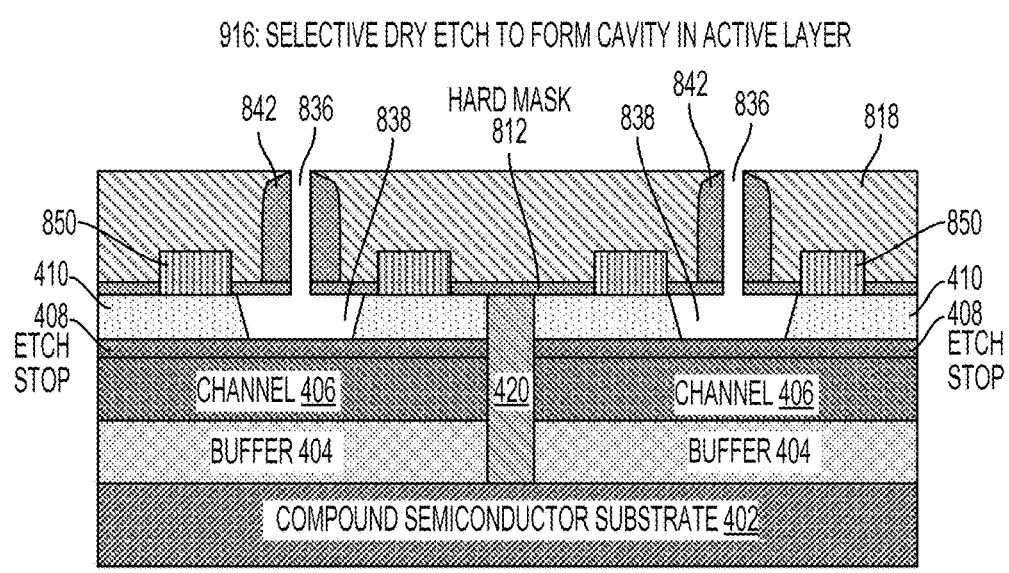

FIG. 9N illustrates a portion of the compound semiconductor FET 800 after step 916 of the self-aligned, gate first process 900 to form cavities 838 in the compound semiconductor active layer 410 according to aspects of the present disclosure. The compound semiconductor active layer 410 may be subjected to a selective dry etch to form cavities 838 in the compound semiconductor active layer 410 exposing the etch stop layer 408. That is, the selective dry etch of the compound semiconductor active layer 410 stops on the etch stop layer 408. After stopping on the etch stop layer 408, a selective, lateral dry etch may continue according to desired dimensions of the cavities 838. The etch lasts longer on the top, creating a wider top region. The etch time controls the size of the cavity, thus controlling how far the source/drain are from the gate.

Figure 9O:
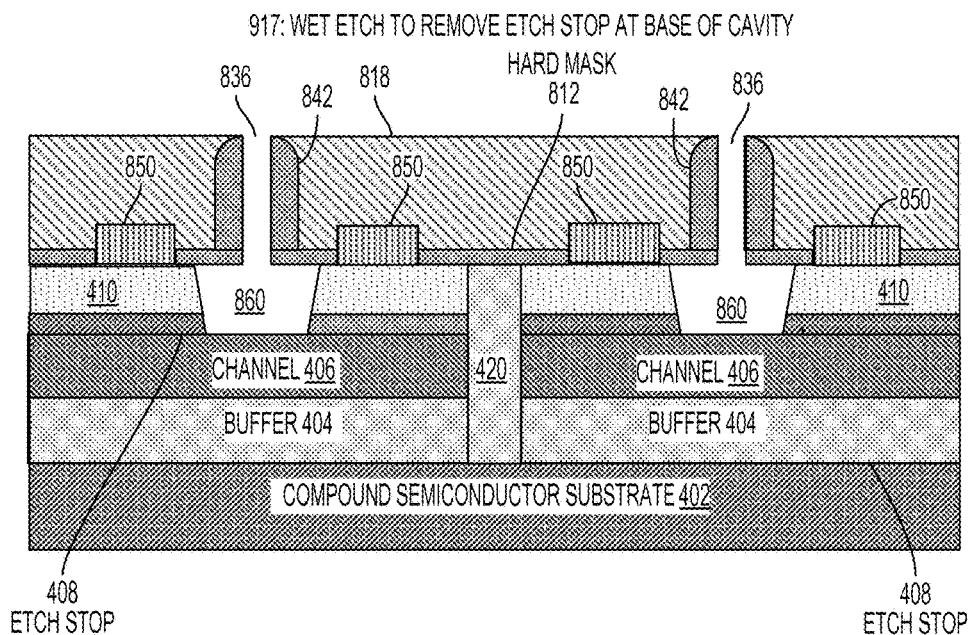

FIG. 9O illustrates a portion of the compound semiconductor FET 800 after step 917 of the self-aligned, gate first process 900 to form recessed gate regions (e.g., cavities 860) in the compound semiconductor active layer 410 according to aspects of the present disclosure. The etch stop layer 408 may be subjected to a selective wet etch to form the recessed gate regions (e.g., cavities 860) in the compound semiconductor active layer 410 exposing the etch stop layer 408. That is, the selective wet etch of the etch stop layer 408 stops on the channel 406. For a MOSFET gate configuration, for example, as shown in FIG. 10, step 917 is skipped, such that the channel 406 is not exposed.

Figure 9P:
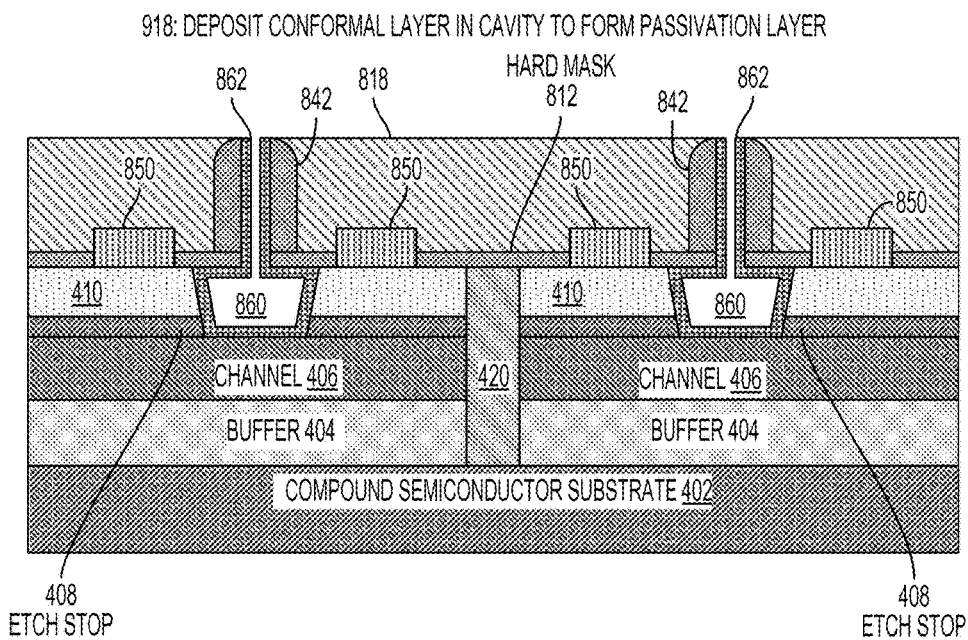

FIG. 9P illustrates a portion of the compound semiconductor FET 800 after step 918 of the self-aligned, gate first process 900 to form a passivation layer 862 in the recessed gate regions (e.g., cavities 860) the compound semiconductor FET 800 according to aspects of the present disclosure. Representatively, a conformal layer may be deposited to line the openings 834 through the pair of gate spacers 842 and the openings 836 in the hard mask 412. The conformal layer also lines the recessed gate regions (e.g., all surfaces of the cavities 860), including the compound semiconductor active layer 410, sidewalls of the etch stop layer 408, and an exposed surface of the channel 406. This process forms a passivation layer 862 for the exposed surfaces of the channel 406 and the etch stop layer 408. For example, the passivation layer 862 may be deposited on a barrier layer of, for example, aluminum gallium arsenide (AlGaAs) that is on the channel 406. For the MOSFET configuration of FIG. 10, the passivation layer 862 does not contact the channel 406.

Figure 9Q:
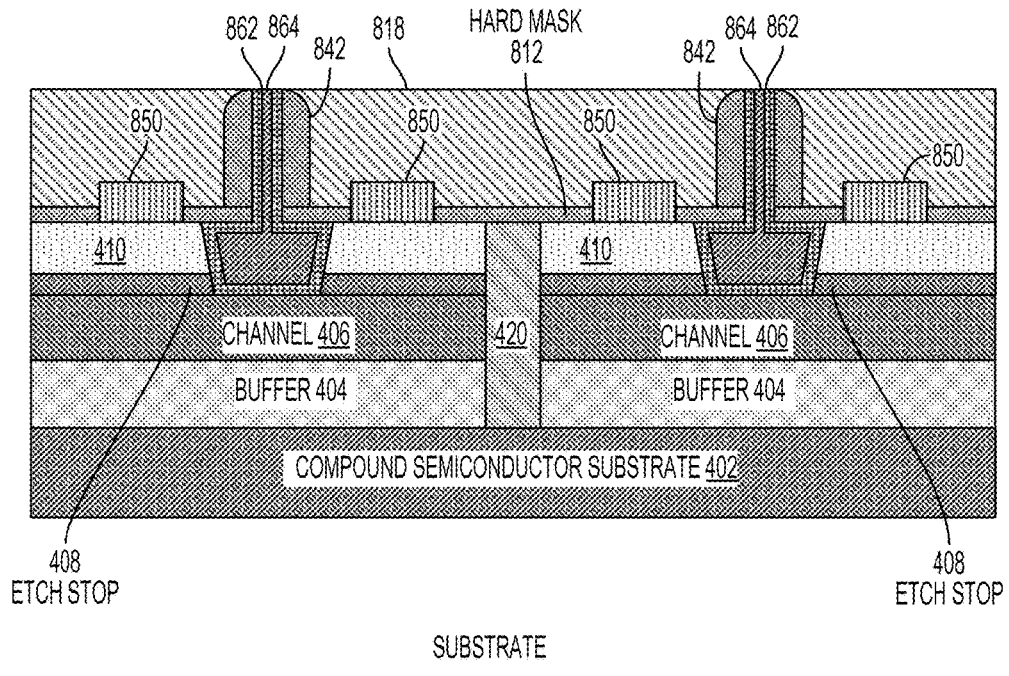

FIG. 9Q illustrates a portion of the compound semiconductor FET 800 after step 919 of the self-aligned, gate first process 900 to form an oxide layer 864 in the recessed gate regions (e.g., cavities 860) of the compound semiconductor FET 800 according to aspects of the present disclosure. Representatively, an oxide layer is deposited on the passivation layer 862 that lines the pair of gate spacers 842 and the openings 836 in the hard mask 812. The oxide layer 864 also fills the recessed gate regions (e.g., cavities 860) that are lined with the passivation layer 862 to form a second oxide layer 462. The oxide layer 864 may be formed by filling the recessed gate regions (e.g., cavities 860) with a spin-on oxide that is subjected to a bake process to form the oxide layer 864 surrounded by the passivation layer 862.

Figure 9R:
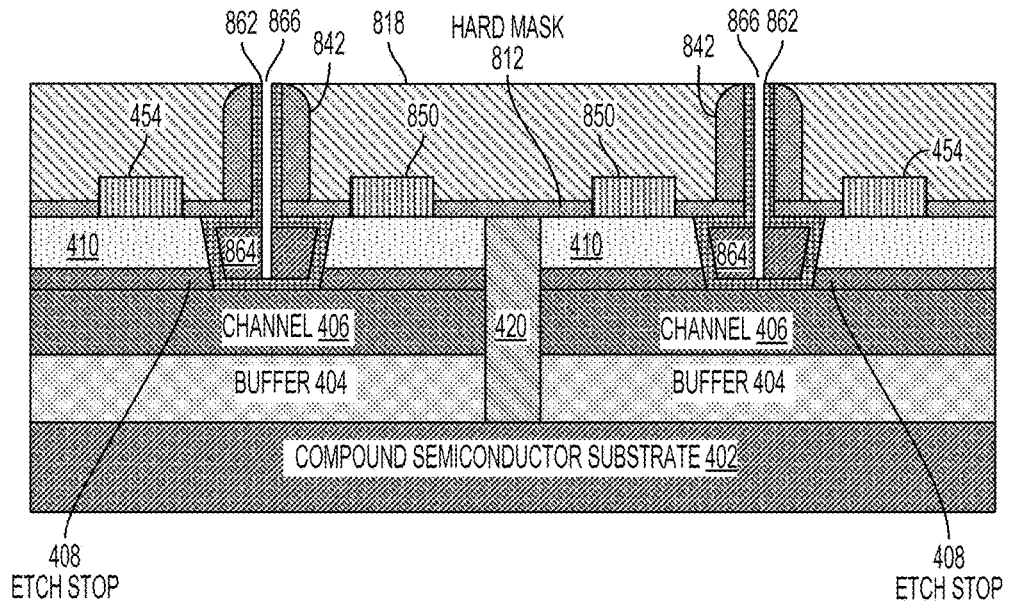

FIG. 9R illustrates a portion of the compound semiconductor FET 800 after step 920 of the self-aligned, gate first process 900 to form openings 866 through the oxide layer 864 and the passivation layer 862 according to aspects of the present disclosure. In this configuration, the oxide layer 864 is dry etched to expose the passivation layer 862 on the channel 406. Once the passivation layer 862 is exposed, the passivation layer 862 is dry etched to expose the channel 406. The dry etch is a directional etch. For the MOSFET configuration of FIG. 10, the dry etch stops on the passivation layer 862 and does not contact the channel 406.

Figure 9S:
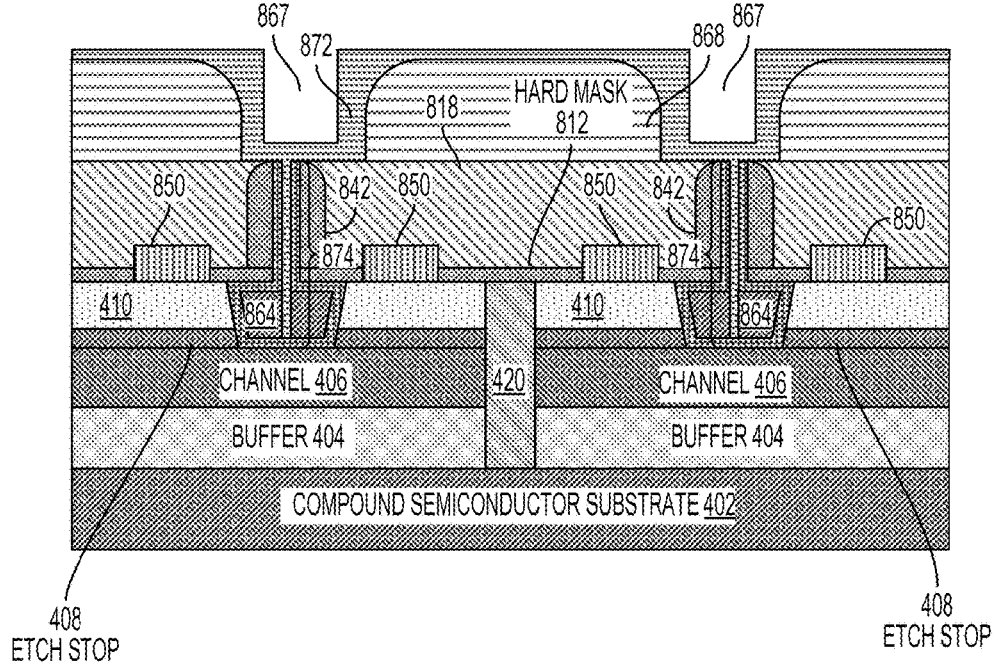

FIG. 9S illustrates a portion of the compound semiconductor FET 800 after step 921 of the self-aligned, gate first process 900 to deposit a first gate material 872 of a base gate 874 according to aspects of the present disclosure. An atomic layer deposition (ALD) process may be performed to deposit the first gate material 872 in the openings 866 (FIG. 9R), on the hard mask 812, and on a resist layer 868. The resist layer 868 is then deposited and patterned on portions of the first dielectric layer 818 according to the predetermined configuration of the head gates 876 (FIG. 9U). The resist layer 868 may be deposited according to a desired configuration of the head gates 876. Once defined, the first gate material 872 may be sputtered to fill the openings 866 (FIG. 9R).

A portion of the first gate material 872 on the hard mask 812 and the resist layer 868 may provide a seed layer for a second gate material. The first gate material 872 may be titanium nitride (TiN), tungsten silicon nitride (WSiN), or other like conductive gate material. Once filled in the openings 866 (FIG. 9R), the first gate material 872 forms the base gate 874 that is self-aligned with subsequently formed source/drain regions (e.g., proximate the ohmic contacts 850). Openings 867 in the first gate material 872 are shown to enable formation of a head gate (e.g., a T-gate) according to aspects of the present disclosure.

Figure 9T:
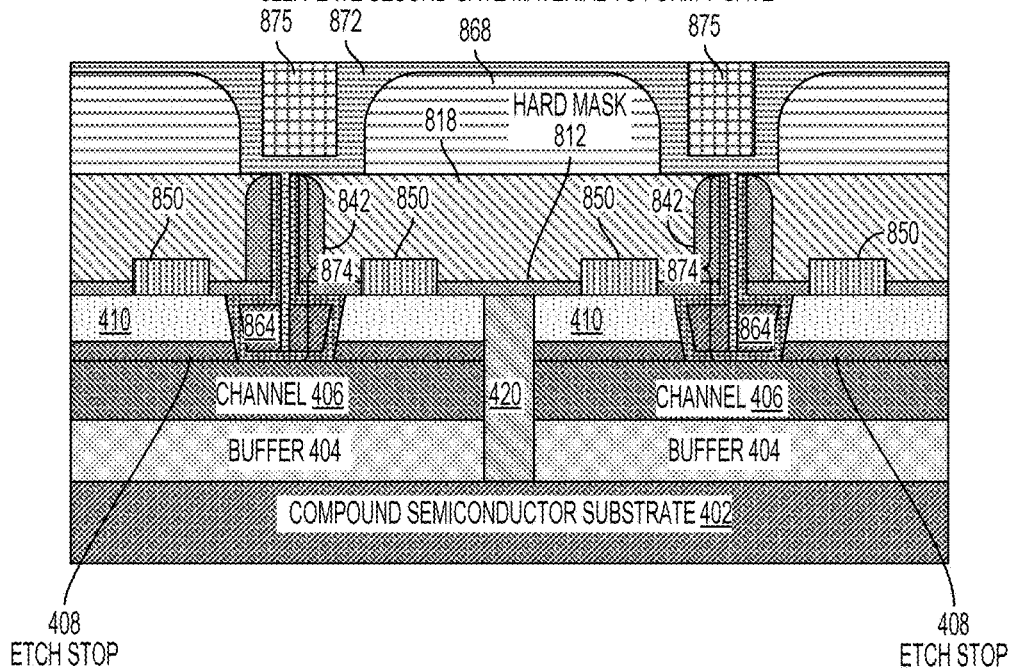
Figure 9U:
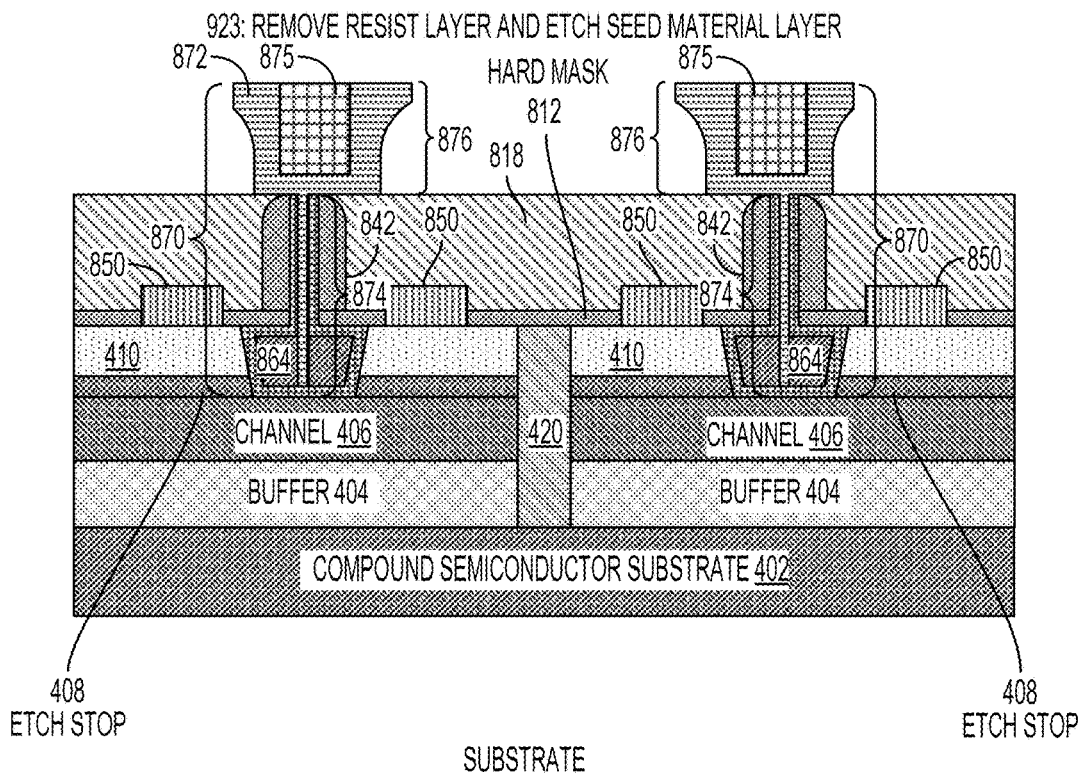

FIG. 9T illustrates a portion of the compound semiconductor FET 800 after step 922 of the self-aligned, gate first process 900 to form a head gate of a T-gate compound semiconductor FET according to aspects of the present disclosure. In this case, the openings 867 in the first gate material 872 determine the shape of a head gate of a T-gate. For example, a plating process may be performed to deposit a second gate material 875 in the openings 867 of the first gate material 872. The second gate material 875 may be gold (Au), or other like conductive gate material, to form the head gates 876.

FIG. 9U illustrates a portion of the compound semiconductor FET 800 after step 923 of the self-aligned, gate first process 900 to form T-gates 870 of the compound semiconductor FET 800 according to aspects of the present disclosure. A stripping process may remove the resist layer 868 according to a predetermined configuration of the T-gates 870. In addition, an etch process removes portions of the first gate material 872, so that remaining portions of the first gate material 872 provide a seed layer for the head gates 876 of the T-gates 870. In this arrangement, the head gates 876 of the T-gates 870 are also supported by the first dielectric layer 818. In addition, the head gates 876 are supported by the pair of gate spacers 842 in the first dielectric layer 818.

FIG. 9V illustrates a portion of the compound semiconductor FET 800 after step 924 of the self-aligned, gate first process 900 to complete formation of the T-gates 870 according to aspects of the present disclosure. Formation of the T-gates 870 is completed by depositing a second dielectric layer 819 to cover the compound semiconductor FET 800. The T-gates 870 each includes a base gate 874 electrically coupled to one of the head gates 876. The configuration of the T-gates 870 may improve a breakdown voltage of the compound semiconductor FET 800, while reducing a source-gate resistance and improving a transmission frequency/maximum frequency (Ft/Fmax). The source-gate resistance is improved by reducing a gate to source/drain space according to the recessed gate region (e.g., cavities 860).

Referring again to FIG. 8, the compound semiconductor FET 800 is shown after step 925 of the self-aligned, gate first process 900 to complete formation of the T-gates 870 according to aspects of the present disclosure. The compound semiconductor FET 800 includes source/drain regions composed of a compound semiconductor active layer 410 (e.g., N+ GaAs). In this figure, dual transistors are shown, separated by the isolation layer 420. In addition, source/drain (S/D) contacts and gate contacts (GC) to the ohmic contacts 850 and the head gates 876 of the compound semiconductor FET 800 are shown. The source/drain regions, which may be proximate the ohmic contacts 850 may be subsequently formed according to a gate first process.

FIG. 10 illustrates a compound semiconductor field effect transistor (FET) 1000 having a self-aligned metal oxide semiconductor (MOS) FET (MOSFET) gate with a reduced gate to source/drain space according to aspects of the present disclosure. In this configuration, the compound semiconductor FET 1000 is shown in a self-aligned MOSFET gate configuration. Representatively, a compound semiconductor material stack of the compound semiconductor FET 1000 may be similar to the compound semiconductor material stack of the compound semiconductor FET 800, shown in FIG. 8. Accordingly, like reference numbers are re-used to identify corresponding portions of the material stack. In FIG. 10, however, the compound semiconductor FET 1000 includes a MOSFET gate.

In aspects of the present disclosure, the compound semiconductor FET 1000 includes T-gates 1070 having a base gate 1074 that extends through a pair of gate spacers 842, and along the hard mask 812 and an oxide layer 864 lined by a passivation layer 862. In this MOSFET gate configuration, however, the base gate 1074 stops on a portion of the passivation layer 862 on the channel 406. The base gate 1074 may be self-aligned with a source/drain region of the compound semiconductor FET 1000, for example, proximate (e.g., below) ohmic contacts 850 on the compound semiconductor active layer 410.

The compound semiconductor FET 1000 includes head gates 1076, which are supported by the pair of gate spacers 842 in the first dielectric layer 818 and electrically coupled to the base gate 1074. The T-gates 1070 include source/drain regions composed of a compound semiconductor active layer 410 (e.g., N+ GaAs). For example, the source/drain regions may be adjacent to the ohmic contacts 850. In this arrangement, dual transistors are shown as separated by the isolation layer 420. Source/drain (S/D) contacts and gate contacts (GC) to the ohmic contacts 850 on the source/drain regions and MOSFET gates of the compound semiconductor FET 1000 are also shown. The source/drain regions may be subsequently formed according to a MOSFET gate first process.

Figure 11:
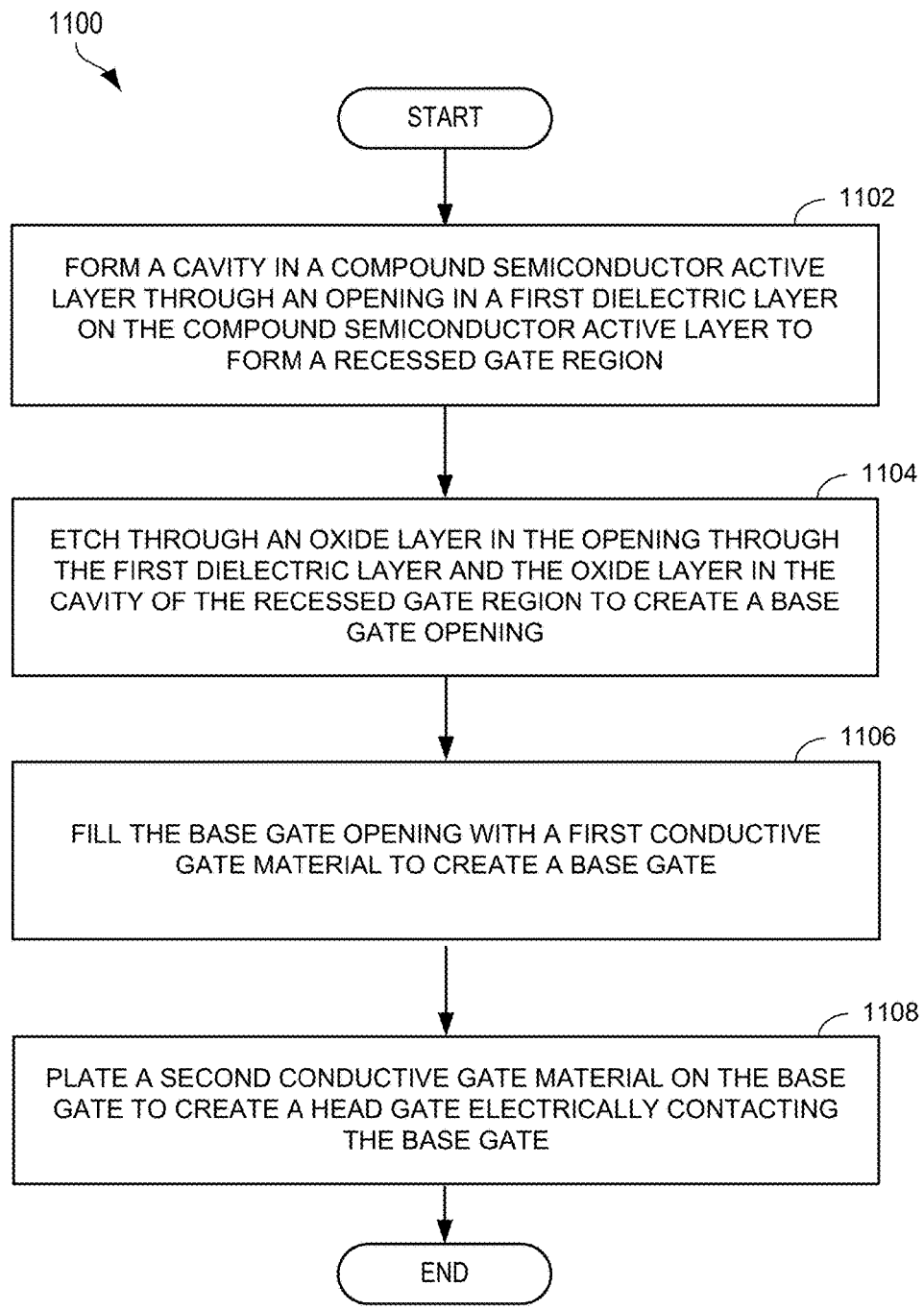
FIG. 11 is a flow diagram illustrating a method of making a compound semiconductor field effect transistor (FET), in accordance with aspects of the present disclosure.

FIG. 11 is a flow diagram illustrating a method 1100 of making a compound semiconductor FET, including a two-portion gate, in accordance with aspects of the present disclosure. The blocks in the method 1100 can be performed in or out of the order shown, and in some aspects, can be performed at least in part in parallel.

The method 1100 begins at block 1102, where a cavity in a compound semiconductor active layer of the compound semiconductor FET is formed through an opening in a first dielectric layer on the compound semiconductor active layer to form a recessed gate region. For example, as shown in steps 916 and 917 of FIGS. 9N and 9O, an etch process including a selective etch followed by a wet etch opens cavities 860 in the compound semiconductor active layer 410. At block 1104, an oxide layer fills the opening through the first dielectric layer and the oxide layer in the cavity of the recessed gate region is etched through to create a base gate opening.

For example, as shown in step 920 of FIG. 9R, openings 866 may expose portions of the channel 406 through the etch stop layer 408 and the passivation layer 862 for a high electron mobility transistor (HEMT) Schottky gate configuration. Alternatively, the openings 464 may stop on an oxide layer, such as the passivation oxide layer 414 to form cavities for the MOSFET configuration, as shown in FIG. 10. That is, in a Schottky gate configuration (FIG. 8), the etch is through the etch stop layer 408 to expose the channel 406. In a MOSFET gate configuration (FIG. 10), the etch stops on a portion of the passivation layer 862 on the etch stop layer 408.

Referring again to FIG. 11, at block 1106, the base gate opening is filled with a first conductive gate material to create a base gate. For example, as shown in step 921 of FIG. 9S, and also FIG. 10, the first gate material (e.g., titanium nitride TiN or tungsten silicon nitride (WSiN)) is deposited in the openings 866 (FIG. 9R). At block 1108, a second conductive gate material is plated on the base gate to create a head gate electrically contacting the base gate. For example, as shown in step 922 of FIG. 9T, a second conductive gate material (e.g., gold Au) is formed on a portion of the first conductive gate material to form a head gate.

Aspects of the present disclosure are directed to an innovative compound semiconductor FET having a gate (e.g., a T-gate) that is self-aligned with a source/drain region at an edge of a recessed gate region. The gate may include a base gate and a head gate, in which a space between the base gate and the source/drain region is reduced to a predetermined value (e.g., 20 nanometers). The reduced gate to source/drain space improves device integration density. The reduced space also improves device performance by reducing, for example, parasitic resistance. Such a device and method may enable a low cost gallium arsenide (GaAs) pseudomorphic high electron mobility transistor (pHEMT) device for 5G wireless communications. The noted gate first processes may be a Schottky gate first process as well as a MOSFET gate first process.

According to additional aspects of the present disclosure, a compound semiconductor material may include, but is not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide nitride (InGaAsN). These are exemplary only, and other materials are possible.

According to a further aspect of the present disclosure, a compound semiconductor FET is described. The compound semiconductor FET may include means for conducting electrons between a source and a drain of the compound semiconductor FET. The electron conductive means may, for example, include a channel 406, as shown in FIGS. 4, 6, and 8. In another aspect, the aforementioned means may be any layer, module, or any apparatus configured to perform the functions recited by the aforementioned means.

Figure 12:
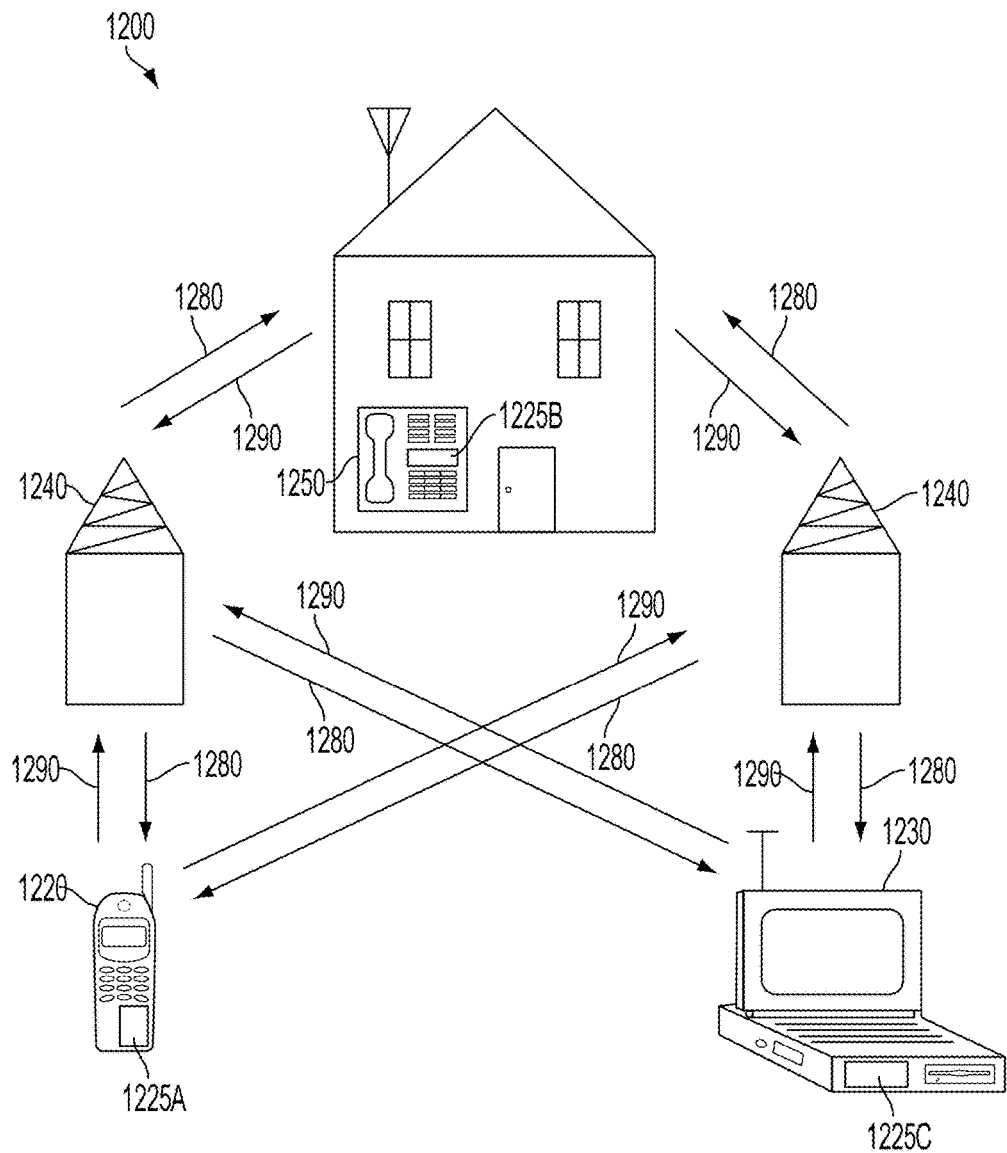
FIG. 12 is a block diagram showing an exemplary wireless communication system in which an aspect of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed compound semiconductor field effect transistors. It will be recognized that other devices may also include the disclosed compound semiconductor field effect transistors, such as the base stations, user equipment, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed compound semiconductor field effect transistors.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A compound semiconductor field effect transistor (FET), comprising:
 a channel layer;
 an etch stop layer on the channel layer;
 a compound semiconductor active layer on the etch stop layer;
 an oxide layer, partially surrounded by a passivation layer, on the channel layer, in which the oxide layer fills a cavity in the compound semiconductor active layer;
 a first dielectric layer on the oxide layer;
 a second dielectric layer on the first dielectric layer; and
 a gate, comprising a base gate through the oxide layer in the cavity and a portion of the passivation layer extending through the first dielectric layer, and a head gate in the second dielectric layer and electrically coupled to the base gate.

2. The compound semiconductor FET of claim 1, further comprising a pair of gate spacers in the first dielectric layer and contacting a portion of the passivation layer that lines an opening through the pair of gate spacers, in which the base gate extends through the portion of the passivation layer that lines the pair of gate spacers.

3. The compound semiconductor FET of claim 1, in which the oxide layer fills the cavity in the compound semiconductor active layer and the etch stop layer.

4. The compound semiconductor FET of claim 3, further comprising a source/drain region in the compound semiconductor active layer being self-aligned with the base gate.

5. The compound semiconductor FET of claim 1, further comprising ohmic contacts on a compound semiconductor active layer of the compound semiconductor FET and electrically contacting a source/drain region of the compound semiconductor FET.

6. The compound semiconductor FET of claim 1, integrated into a power amplifier, in which the power amplifier is incorporated into at least one of a music player, a video player, an entertainment unit, a navigation device, a communications device, a personal digital assistant (PDA), a fixed location data unit, a mobile phone, and a portable computer.

7. A radio frequency (RF) front end module, comprising:
 a chip, comprising a channel layer, an etch stop layer on the channel layer, a compound semiconductor active layer on the etch stop layer, an oxide layer partially surrounded by a passivation layer on the channel layer, in which the oxide layer fills a cavity in the compound semiconductor active layer, a first dielectric layer on the oxide layer, and a gate, comprising a base gate through the oxide layer in the cavity and a portion of the passivation layer extending through the first dielectric layer, and a head gate in a second dielectric layer on the first dielectric layer and electrically coupled to the base gate; and
 an antenna coupled to an output of the chip.

8. The RF front end module of claim 7, further comprising a pair of gate spacers in the first dielectric layer and contacting a portion of the passivation layer that lines an opening through the pair of gate spacers, in which the base gate extends through the portion of the passivation layer that lines the pair of gate spacers.

9. The RF front end module of claim 7, in which the oxide layer fills the cavity in the compound semiconductor active layer and the etch stop layer.

10. The RF front end module of claim 9, in which a source/drain region in the compound semiconductor active layer is self-aligned with the base gate.

11. The RF front end module of claim 7, incorporated into at least one of a music player, a video player, an entertainment unit, a navigation device, a communications device, a personal digital assistant (PDA), a fixed location data unit, a mobile phone, and a portable computer.

12. A compound semiconductor field effect transistor (FET), comprising:
 means for conducting electrons between a source and a drain;
 an etch stop layer on the means for conducting electrons;
 a compound semiconductor active layer on the etch stop layer;
 an oxide layer, partially surrounded by a passivation layer, on the means for conducting electrons, in which the oxide layer fills a cavity in the compound semiconductor active layer;
 a first dielectric layer on the oxide layer;
 a second dielectric layer on the first dielectric layer; and
 a gate, comprising a base gate through the oxide layer in the cavity and a portion of the passivation layer extending through the first dielectric layer, and a head gate in the second dielectric layer and electrically coupled to the base gate.

13. The compound semiconductor FET of claim 12, integrated into a power amplifier, in which the power amplifier is incorporated into at least one of a music player, a video player, an entertainment unit, a navigation device, a communications device, a personal digital assistant (PDA), a fixed location data unit, a mobile phone, and a portable computer.

* * * * *